US012812992B2

(12) United States Patent
Shirahige et al.

(10) Patent No.: US 12,812,992 B2
(45) Date of Patent: Nov. 24, 2026

(54) PHOTOELECTRIC CONVERSION DEVICE HAVING INSULATOR WITH A BAND SHAPE, AND PHOTOELECTRIC CONVERSION SYSTEM

(71) Applicant: CANON KABUSHIKI KAISHA, Tokyo (JP)

(72) Inventors: Daiki Shirahige, Kanagawa (JP); Shuhei Hayashi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 411 days.

(21) Appl. No.: 18/491,559

(22) Filed: Oct. 20, 2023

(65) Prior Publication Data

US 2024/0145502 A1 May 2, 2024

(30) Foreign Application Priority Data

Oct. 26, 2022 (JP) ................................ 2022-171846

(51) Int. Cl.
*H10F 39/00* (2025.01)

(52) U.S. Cl.
CPC ... *H10F 39/80373* (2025.01); *H10F 39/8023* (2025.01); *H10F 39/811* (2025.01); *H10F 39/8063* (2025.01)

(58) Field of Classification Search
CPC ............................ H10F 39/811; H10F 39/199
See application file for complete search history.

(56) References Cited

U.S. PATENT DOCUMENTS

| | | | | |
|---|---|---|---|---|
| 12,027,562 B2 * | 7/2024 | Miyake | ................ | H04N 25/778 |
| 2021/0084249 A1 * | 3/2021 | Nakazawa | ............ | H10F 39/811 |
| 2021/0400224 A1 * | 12/2021 | Gocho | ................ | H04N 25/587 |
| 2022/0271070 A1 * | 8/2022 | Nakazawa | ........... | H04N 25/778 |
| 2022/0367558 A1 * | 11/2022 | Fujii | ..................... | H10F 39/011 |
| 2023/0317760 A1 * | 10/2023 | Yang | ..................... | H10F 39/199 257/292 |

FOREIGN PATENT DOCUMENTS

| | | |
|---|---|---|
| WO | 2019130702 A1 | 7/2019 |
| WO | 2019131965 A1 | 7/2019 |
| WO | 2022124086 A1 | 6/2022 |

* cited by examiner

*Primary Examiner* — Benjamin P Sandvik
(74) *Attorney, Agent, or Firm* — Canon U.S.A., Inc. IP Division

(57) ABSTRACT

A photoelectric conversion device includes a first component and a second component. The first component comprises a first semiconductor substrate having first and second surfaces, a first photoelectric conversion portion, a second photoelectric conversion portion, an FD portion, a first transfer gate that transfers signal charges generated in the first photoelectric conversion portion to the FD portion, and a second transfer gate that transfers signal charges generated in the second photoelectric conversion portion to the FD portion. The second component comprises a second semiconductor substrate having third and fourth surfaces, including a band-shaped insulator filled into a through-hole formed in the second semiconductor substrate, and being laminated on the first component. The insulator includes first and second contacts connected respectively to the first and second transfer gates, and a direction in which the first and second contacts are aligned intersects a longitudinal direction of the insulator at an acute angle.

10 Claims, 17 Drawing Sheets

PHOTOELECTRIC CONVERSION DEVICE HAVING INSULATOR WITH A BAND SHAPE, AND PHOTOELECTRIC CONVERSION SYSTEM

BACKGROUND

Technical Field

The present disclosure relates to a photoelectric conversion device and a photoelectric conversion system.

Description of the Related Art

Aiming to realize higher-density integration of pixels in a photoelectric conversion device, International Publication No. 2019/130702 discloses a technique of disposing a photoelectric conversion portion included in a pixel on a first semiconductor substrate, disposing a pixel circuit included in the pixel on a second semiconductor substrate, and laminating the first semiconductor substrate and the second semiconductor substrate.

The technique disclosed in International Publication No. 2019/130702 does not discuss a detailed arrangement of a contact connected to a gate of a transistor disposed on the first semiconductor substrate and a contact connected to a gate of a transistor disposed on the second semiconductor substrate.

SUMMARY

The present disclosure provides a proper arrangement of the contact connected to the transistor disposed on the first semiconductor substrate and the contact connected to the transistor disposed on the second semiconductor substrate. According to an aspect, the present disclosure provides a photoelectric conversion device that includes a first component and a second component. The first component includes a first semiconductor substrate, a first photoelectric conversion portion, a second photoelectric conversion portion, a floating diffusion portion, and a first transfer gate. The first semiconductor substrate has a first surface and a second surface opposite to the first surface. The first photoelectric conversion portion is arranged to receive light from the second surface. The second photoelectric conversion portion is arranged to receive light from the second surface. The first transfer gate is disposed on a side including the first surface and transfers signal charges generated in the first photoelectric conversion portion to the floating diffusion portion. A second transfer gate is disposed on the side including the first surface and transfers signal charges generated in the second photoelectric conversion portion to the floating diffusion portion. The second component includes a second semiconductor substrate and an insulator. The second semiconductor substrate has a third surface and a fourth surface opposite to the third surface. The insulator has a band shape and is filled into a through-hole formed in the second semiconductor substrate. The second component and the first component are laminated to each other. The insulator includes a first contact connected to the first transfer gate and a second contact connected to the second transfer gate. The second contact is positioned closest to the first contact. A direction in which the first contact and the second contact are aligned intersects a longitudinal direction of the insulator at an acute angle.

According to an aspect, the present disclosure provides a photoelectric conversion device that includes a first component and a second component. The first component includes a first semiconductor substrate, a first photoelectric conversion portion, a second photoelectric conversion portion, a first transfer gate, a second transfer gate, and a floating diffusion portion. The first semiconductor substrate has a first surface and a second surface opposite to the first surface. The first photoelectric conversion portion is arranged to receive light from the second surface. The second photoelectric conversion portion is arranged to receive light from the second surface. The first transfer gate is disposed on a side including the first surface and transfers signal charges generated in the first photoelectric conversion portion to the floating diffusion portion. The second transfer gate is disposed on the side including the first surface and transfers signal charges generated in the second photoelectric conversion portion to the floating diffusion portion. The second component includes a second semiconductor substrate and an insulator. The second semiconductor substrate has a third surface and a fourth surface opposite to the third surface. The insulator is filled into a through-hole formed in the second semiconductor substrate. The second component and the first component are laminated to each other. The insulator includes a first contact connected to the first transfer gate and a second contact connected to the second transfer gate. The second contact is positioned closest to the first contact. A direction in which the first contact and the second contact are aligned intersects at an acute angle a direction in which the first photoelectric conversion portion and the second photoelectric conversion portion are aligned.

According to an aspect, the present disclosure provides a photoelectric conversion device that includes a first component and a second component. The first component includes a first semiconductor substrate, a first photoelectric conversion portion, a second photoelectric conversion portion, a first transfer gate, a second transfer gate, and a floating diffusion portion. The first semiconductor substrate has a first surface and a second surface opposite to the first surface. The first photoelectric conversion portion is arranged to receive light from the second surface. The second photoelectric conversion portion is arranged to receive light from the second surface. The first transfer gate is disposed on a side including the first surface and transfers signal charges generated in the first photoelectric conversion portion to the floating diffusion portion. The second transfer gate is disposed on the side including the first surface and transfers signal charges generated in the second photoelectric conversion portion to the floating diffusion portion. The second component including a second semiconductor substrate and multiple insulators. The second semiconductor substrate has a third surface and a fourth surface opposite to the third surface. Multiple insulators each have a band shape and penetrate through the second semiconductor substrate. The second component and the first component are laminated to each other. Each of the insulators is filled into a through-hole formed in the second semiconductor substrate and includes a first contact connected to the first transfer gate and a second contact connected to the second transfer gate. The second contact is positioned closest to the first contact. The first transfer gate and the second transfer gate are line-symmetric with respect to a longitudinal direction of the insulator in a plan view.

Further features of the disclosure will become apparent from the following description of exemplary embodiments with reference to the attached drawings.

DESCRIPTION OF THE EMBODIMENTS

Figure 1:
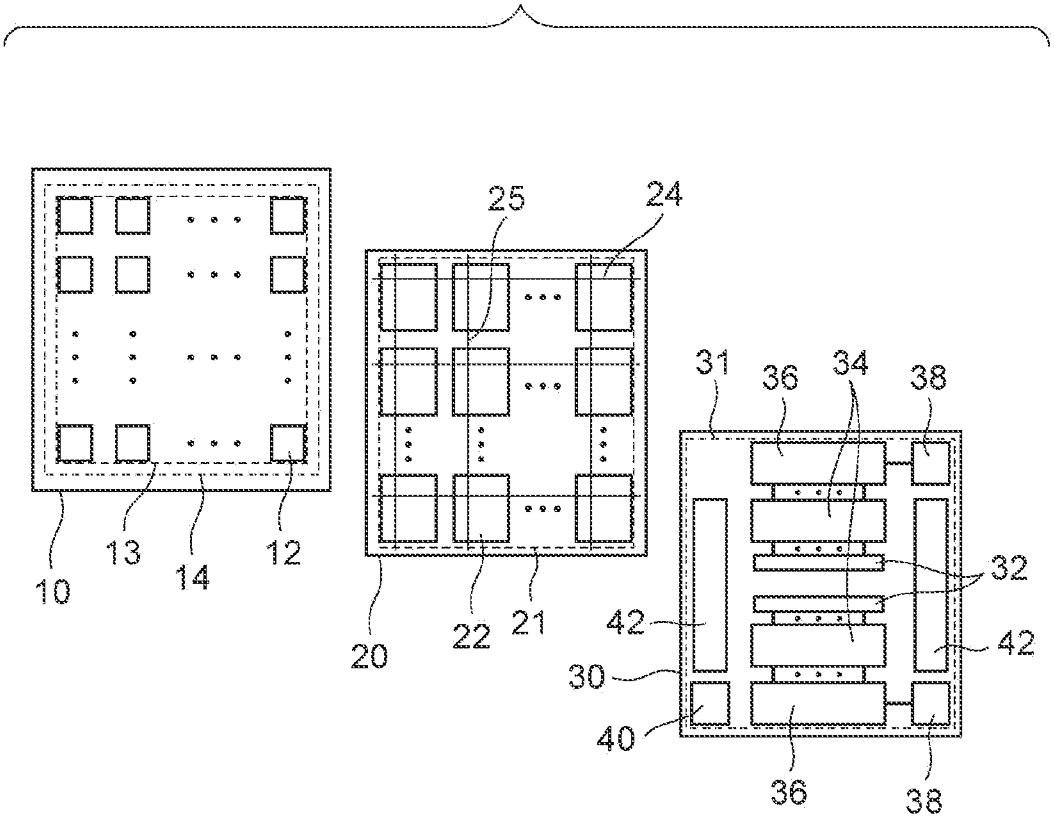
FIG. 1 is a schematic view illustrating a configuration of a photoelectric conversion device according to a first embodiment.

Embodiments will be described below with reference to the drawings.

In the following embodiments, an image capturing device is mainly described as an example of the photoelectric conversion device. However, the embodiments are not limited to the image capturing device and can be further applied to other examples of the photoelectric conversion device. Those other examples include a ranging device (such as a device for measuring a distance with focus detection or TOF (Time Of Flight), a photometric device (such as a device for measuring a quantity of incident light), and so on.

A semiconductor region, a conductivity type of a well, and an injected dopant described in the following embodiments are merely examples, and the conductivity type and the dopant are not limited to only those ones described in the embodiments. The conductivity type and the dopant described in the embodiments can be changed as appropriate, and potentials of the semiconductor region and the well are changed as appropriate depending on the changes of the conductivity type and the dopant.

A conductivity type of a transistor described in the following embodiments is merely an example, and the conductivity type of the transistor is not limited to only that one described in the embodiments. The conductivity type described in the embodiments can be changed as appropriate, and potentials of a gate, a source, and a drain of the transistor are changed as appropriate depending on the change of the conductivity type.

In the case of a transistor operating as a switch, for example, a low level and a high level of the potential supplied to the gate may be changed to the level reversal to that described in the embodiments depending on the change of the conductivity type. Furthermore, the conductivity type of the semiconductor region described in the following embodiments is merely an example, and the conductivity type of the semiconductor region is not limited to only the one described in the embodiments. The conductivity type described in the embodiments can be changed as appropriate, and a potential of the semiconductor region is changed as appropriate depending on the change of the conductivity type.

In the following embodiments, connection between elements of a circuit is described in some cases. In those cases, even when another element is interposed between the elements of interest, the elements of interest are handled as being connected to each other unless otherwise specified. For example, it is supposed that an element A is connected to one node of a capacitive element C having multiple nodes and an element B is connected to another node. Even in such a case, the element A and the element B are handled as being connected to each other unless otherwise specified.

A metal member, such as a wiring or a pad, described in this Specification may be made of a single metal of one certain element or by a mixture (alloy). For example, the wiring described as a copper wiring may be made of copper alone or may contain a different ingredient in addition to copper as a main ingredient. In another example, the pad connected to an external terminal may be made of aluminum alone or may contain a different ingredient in addition to aluminum as a main ingredient. The copper wiring and the aluminum pad are merely examples, and materials of the wiring and the pad can be changed to any of other suitable metals. The wiring and the pad mentioned here are merely examples of the metal members used in the photoelectric conversion device, and the above explanation can be applied to other metal members as well.

First Embodiment

A first embodiment will be described below with reference to the drawings.

FIG. 1 illustrates an example of a schematic configuration of an image capturing device 1 (example of the photoelectric conversion device) according to the first embodiment of the present disclosure. The image capturing device 1 includes three substrates (a semiconductor substrate 14, a semiconductor substrate 21, and a semiconductor substrate 31). The image capturing device 1 is a three-dimensional image capturing device that is constituted by bonding three components (a first component 100, a second component 200, and a third component 300) together (see FIG. 3). The first component 100, the second component 200, and the third component 300 are laminated in order mentioned from above.

The first component 100 includes multiple sensor portions 12 on a semiconductor substrate 14. The sensor portions 12 perform photoelectric conversion. The semiconductor substrate 14 corresponds to a practical example of a "first semiconductor substrate" in the present disclosure. The sensor portions 12 are disposed in a pixel region 13 of the first component 100 in a matrix form.

The second component 200 includes a read circuit 22 on the semiconductor substrate 21 per four sensor portions 12. The read circuit 22 outputs a pixel signal in accordance with electric charges output from the sensor portions 12. The semiconductor substrate 21 corresponds to a practical example of a "second semiconductor substrate" in the present disclosure. The second component 200 includes multiple pixel drive lines 24 extending in a row direction and multiple pixel output lines 25 extending in a column direction.

The third component 300 includes a logic circuit on a semiconductor substrate 31, the logic circuit processing the pixel signal. The semiconductor substrate 31 corresponds to a practical example of a "third semiconductor substrate" in the present disclosure.

The logic circuit includes, for example, a vertical scanning circuit 42, a column signal processing circuit 34, a horizontal scanning circuit 32, and a control circuit 36. The logic circuit (specifically, the horizontal scanning circuit 32) outputs an output voltage Vout for each sensor portion 12 to the outside. In the logic circuit, for example, a low-resistance region may be formed on a surface of an impurity diffusion region in contact with a source electrode and a drain electrode. The low-resistance region is made of silicide, such as $CoSi_2$ or NiSi, which is formed by using a salicide (Self Aligned Silicide) process.

In an example, the vertical scanning circuit 42 sequentially selects the multiple sensor portions 12 row by row. In an example, the column signal processing circuit 34 executes the CDS (Correlated Double Sampling) process on the pixel signal output from each of the sensor portions 12 in a row that is selected by the vertical scanning circuit 42. By executing the CDS process, for example, the column signal processing circuit 34 extracts the signal level of the pixel signal and holds pixel data corresponding to the quantity of light received by each sensor portion 12. The column signal processing circuit 34 may include an analog-to-digital (AD) converter for converting a signal (analog signal) output from an amplifier transistor AMP to a digital signal. In an example, the horizontal scanning circuit 32 sequentially outputs the pixel data held in the column signal processing circuit 34 to the outside. In an example, the control circuit 36 controls the driving of each block (including the vertical scanning circuit 42, the column signal processing circuit 34, and the horizontal scanning circuit 32) in the logic circuit.

Figure 2:
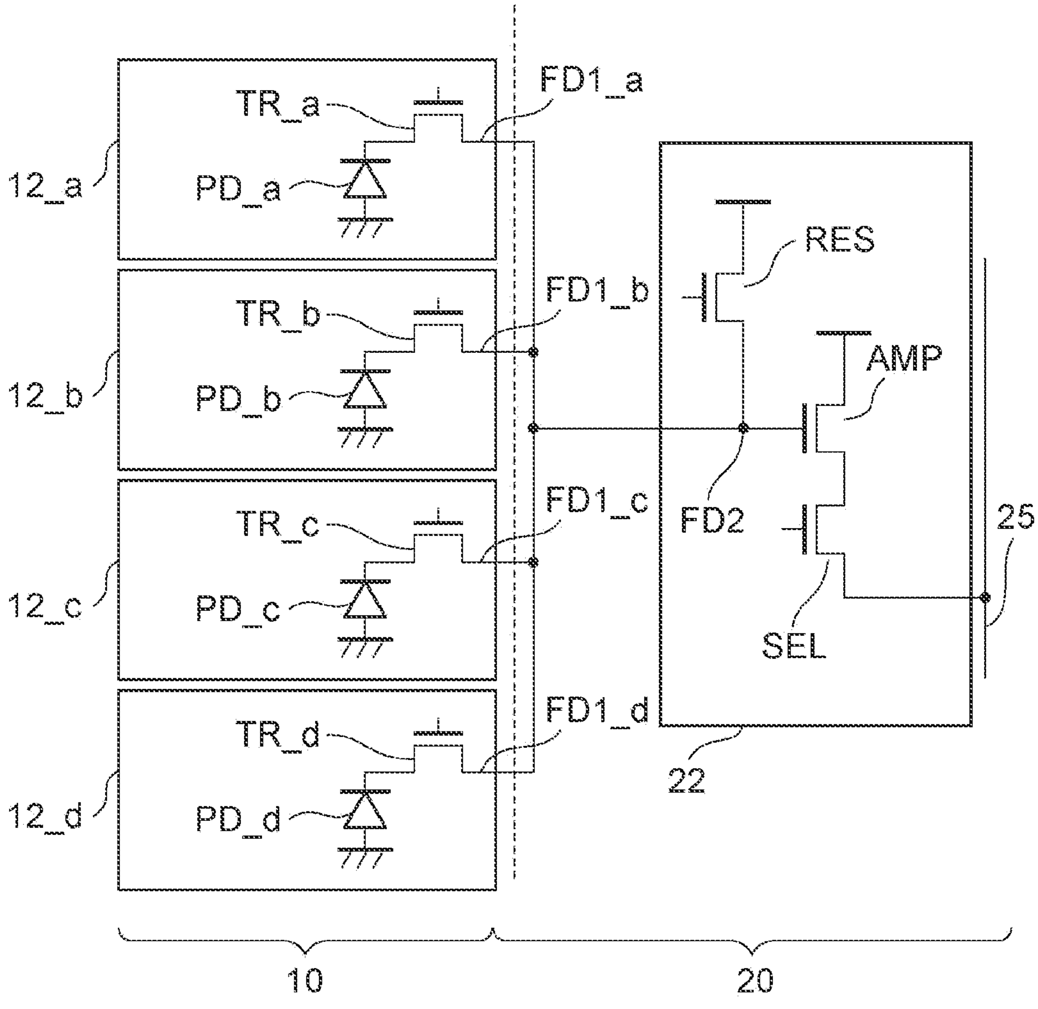
FIG. 2 illustrates configurations of sensor portions and a read circuit.

FIG. 2 illustrates an example of configurations of the sensor portions 12. FIG. 2 represents an example of the sensor portions 12 and the read circuit 22. The following description is made in connection with the case in which four sensor portions 12_*a* to 12_*d* share one read circuit 22 as illustrated in FIG. 2. Here, the word "share" indicates that outputs of the four sensor portions 12_*a* to 12_*d* are input to the common read circuit 22. When matters common to the sensor portions 12_*a* to 12_*d* are explained in the following, they are collectively expressed as the sensor portions 12. This point is similarly applied to other constituent elements than the sensor portion.

The sensor portions 12 include constituent elements common to them. Each of the sensor portions 12 includes, for example, a photodiode PD, a transfer transistor TR electrically connected to the photodiode PD, and a first FD node FD1 that is part of a floating diffusion (FD). The photodiodes and transfer gates in the individual sensor portions 12 (the sensor portions 12_*a* to 12_*d*) are denoted by adding suffixes a to d to reference symbols. The read circuit 22 includes a second FD node FD2 that is another part of the floating diffusion FD and that temporality holds electric charges output from the photodiode PD through the transfer transistor TR. Four first FD nodes FD1_*a* to FD1_*d* are connected to one second FD node FD2. The second FD node FD2 is an input node of the amplifier transistor AMP.

The photodiode PD corresponds to a practical example of a "photoelectric conversion portion" in the present disclosure. More specifically, PD_a corresponds to a "first photoelectric conversion portion", and PD_b corresponds to a "second photoelectric conversion portion". The photodiode PD performs photoelectric conversion and generates electric charges corresponding to an amount of received light. A cathode of the photodiode PD is electrically connected to a source of the transfer transistor TR, and a potential applied to a well region is applied to an anode of the photodiode PD. In other words, the anode of the photodiode PD is electrically connected to a reference potential line (for example, a ground potential). The photodiode PD is disposed within the well region connected to the reference potential line. A drain of the transfer transistor TR is electrically connected to the floating diffusion FD, and a gate of the transfer transistor TR is electrically connected to a pixel drive line 24. The transfer transistor TR is, for example, a CMOS (Complementary Metal Oxide Semiconductor) transistor.

The floating diffusions FD of the sensor portions 12 sharing one read circuit 22 are electrically connected to each other and are further electrically connected to an input terminal of the common read circuit 22. The read circuit 22 includes, for example, a reset transistor RES, a selection transistor SEL, and the amplifier transistor AMP. The selection transistor SEL may be omitted in some cases. A source of the reset transistor RES (an input terminal of the read circuit 22) is electrically connected to the floating diffusion FD. A drain of the reset transistor RES is electrically connected to a power supply line (SVDD) and a drain of the amplifier transistor AMP. A gate of the reset transistor RES is electrically connected to the pixel drive line 24 (see FIG. 1). A source of the amplifier transistor AMP is electrically connected to a drain of the selection transistor SEL, and a gate of the amplifier transistor AMP is electrically connected to the source of the reset transistor RES.

A source of the selection transistor SEL (an output terminal of the read circuit 22) is electrically connected to a pixel output line 25, and a gate of the selection transistor SEL is electrically connected to the pixel drive line 24 (see FIG. 1).

When the transfer transistor TR is turned on, the transfer transistor TR transfers the electric charges in the photodiode PD to the floating diffusion FD. The reset transistor RES resets the potential of the floating diffusion FD to a predetermined potential. When the reset transistor RES is turned on, the reset transistor RES resets the potential of the floating diffusion FD to a potential of the power supply line (SVDD). The selection transistor SEL controls output timing of the pixel signal from the read circuit 22. The amplifier transistor AMP generates, as the pixel signal, a signal with a voltage corresponding to a level of the electric charges held in the floating diffusion FD. The amplifier transistor AMP constitutes a source-follower amplifier and outputs the pixel signal with the voltage corresponding to the level of the electric charges generated in the photodiode PD. When the selection transistor SEL is turned on, the amplifier transistor AMP amplifies the potential of the floating diffusion FD and outputs a voltage corresponding to the amplified potential to the column signal processing circuit 34 through the pixel output line 25. The reset transistor RES, the amplifier transistor AMP, and the selection transistor SEL are each, for example, a CMOS transistor.

The reset transistor RES may be disposed between the power supply line (SVDD) and the amplifier transistor AMP. In this case, the drain of the reset transistor RES is electrically connected to the power supply line (SVDD) and the drain of the selection transistor SEL. The source of the selection transistor SEL is electrically connected to the drain of the amplifier transistor AMP, and the gate of the selection transistor SEL is electrically connected to the pixel drive line 24 (see FIG. 1). The source of the amplifier transistor AMP (the output terminal of the read circuit 22) is electrically connected to the pixel output line 25, and the gate of the amplifier transistor AMP is electrically connected to the source of the reset transistor RES. A transistor for changing a capacitance value of the FD may be further disposed in an electric path between the reset transistor RES and the second FD node FD2.

Figure 3:
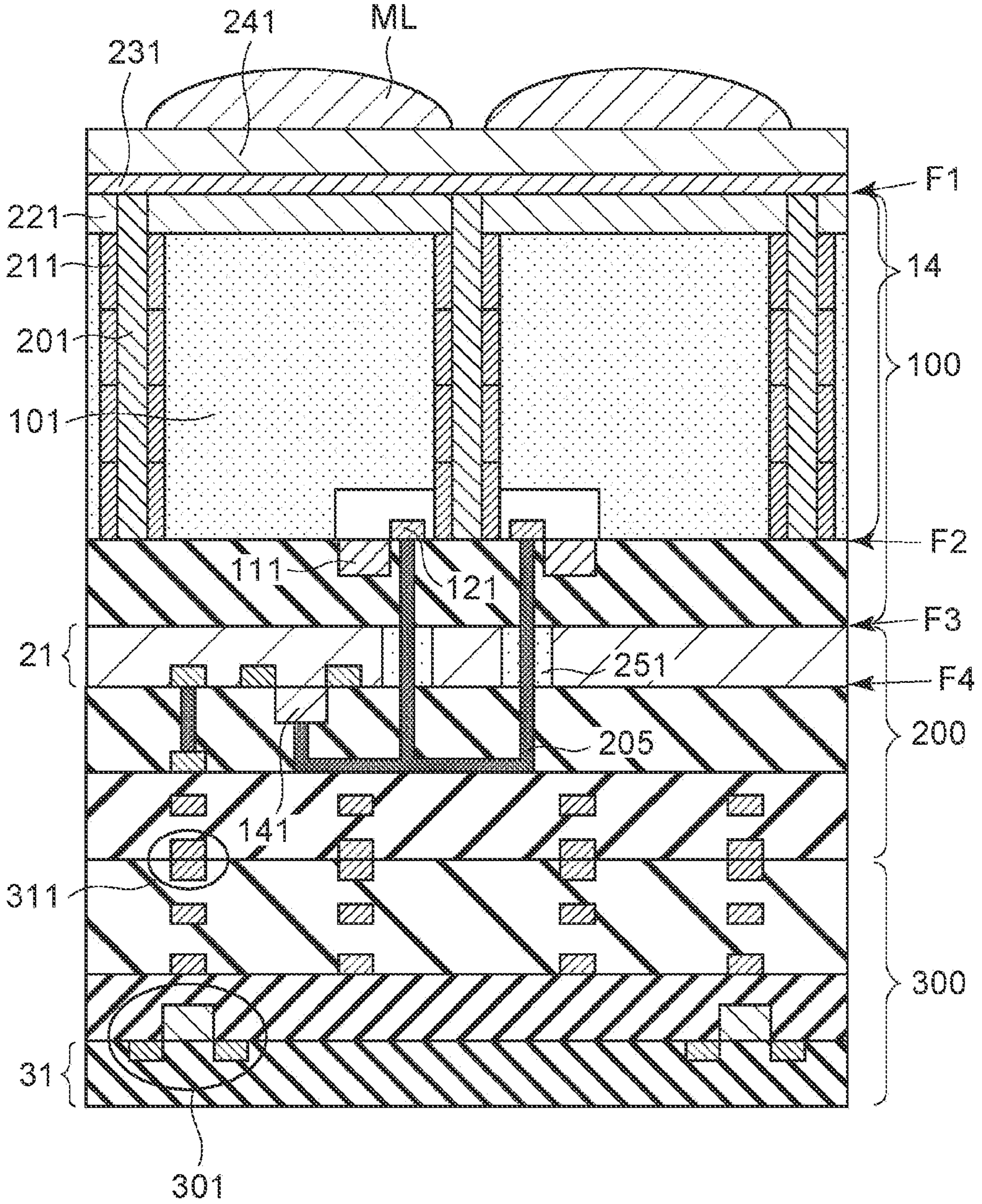
FIG. 3 is a sectional view of the photoelectric conversion device according to the first embodiment.

FIG. 3 is a sectional view of the photoelectric conversion device according to the first embodiment. This sectional view represents a cross-section taken along a line passing the photodiode PD and the gate of the transfer transistor TR in the first component 100, the second component 200, and the third component 300. A semiconductor region 101 represents the photodiode PD. In other words, the semiconductor region 101 is a photoelectric conversion region where signal charges (electrons in this embodiment) are generated in response to incident light and are accumulated. The semiconductor region 101 is an N-type impurity region.

While FIG. 2 illustrates the configuration that the four sensor portions 12 are connected to the one amplifier transistor AMP, two sensor portions 12 appearing in one cross-section among the four sensor portions 12 are illustrated in the sectional view of FIG. 3.

A transfer gate 111 of the transfer transistor TR controls conduction between the semiconductor region 101 and a semiconductor region 121 (first semiconductor region) serving as the first FD node FD1. The semiconductor region 121 is an N-type semiconductor region. A pixel separation portion 201 is disposed between multiple semiconductor regions 101 to electrically separates the semiconductor regions 101 from each other. The pixel separation portion 201 may be constituted as a portion including an insulator, such as silicon oxide, or may be a semiconductor region forming a potential barrier. Typically, the pixel separation portion 201 is a semiconductor region where electric charges with polarity opposite to that of the signal charges accumulated in the photodiode PD are main carriers. A pixel separation layer 211 is disposed between the pixel separation portion 201 and the semiconductor region 101. The pixel separation layer 211 has a role of reducing a dark current particularly when the pixel separation portion 201 is constituted by the insulator.

The semiconductor region 121 serving as the first FD node FD1 and a gate 141 of the amplifier transistor AMP are connected to each other with a conductor 205 interposed therebetween. The conductor 205 mainly contains a metal such as tungsten or copper. The conductor 205 is formed to penetrate through an insulator 251 that separates the semiconductor substrate 21. The insulator 251 electrically isolates the multiple read circuits 22 from each other. The insulator 251 is formed to penetrate through the semiconductor substrate 21 from a third surface F3 to a fourth surface F4. Stated another way, the insulator 251 fills a through-hole formed in the semiconductor substrate 21.

The semiconductor substrate 14 has a first surface F1 on a side closer to an incident surface and a second surface F2 opposite to the first surface. A semiconductor region 221 is a P-type semiconductor region disposed on a side adjacent to the first surface F1 (incident surface) of the semiconductor region 101. A fixed charge film 231 is disposed on the first surface F1 of the semiconductor substrate 14. The semiconductor region 221 and the fixed charge film 231 serve to reduce the dark current entering the semiconductor region 101.

A microlens ML guides light to the semiconductor region 101. A planarization layer 241 is disposed between the microlens ML and the fixed charge film 231. A color filter may be further disposed for each of the sensor portions 12 to make color separation.

The first component 100, the second component 200, and the third component 300 are laminated. The second component 200 is disposed between the first component 100 and the third component 300. A transistor 301 is disposed on the semiconductor substrate 31 of the third component 300. The second component 200 and the third component 300 are electrically connected to each other through a connecting portion 311. The connecting portion 311 is made of a metal.

Typically, the connecting portion 311 mainly contains copper. The connecting portion 311 further contains a barrier metal (such as titanium or nickel) to suppress diffusion of the copper. At a bonding surface where the connecting portion 311 is formed, insulators surrounding the connecting portion 311 are bonded to each other.

While this embodiment is described in connection with the configuration in which four photodiodes PD share one second FD node FD2, the present disclosure is not limited to that configuration. Five or more photodiodes PD may share one second FD node FD2.

Figure 4:
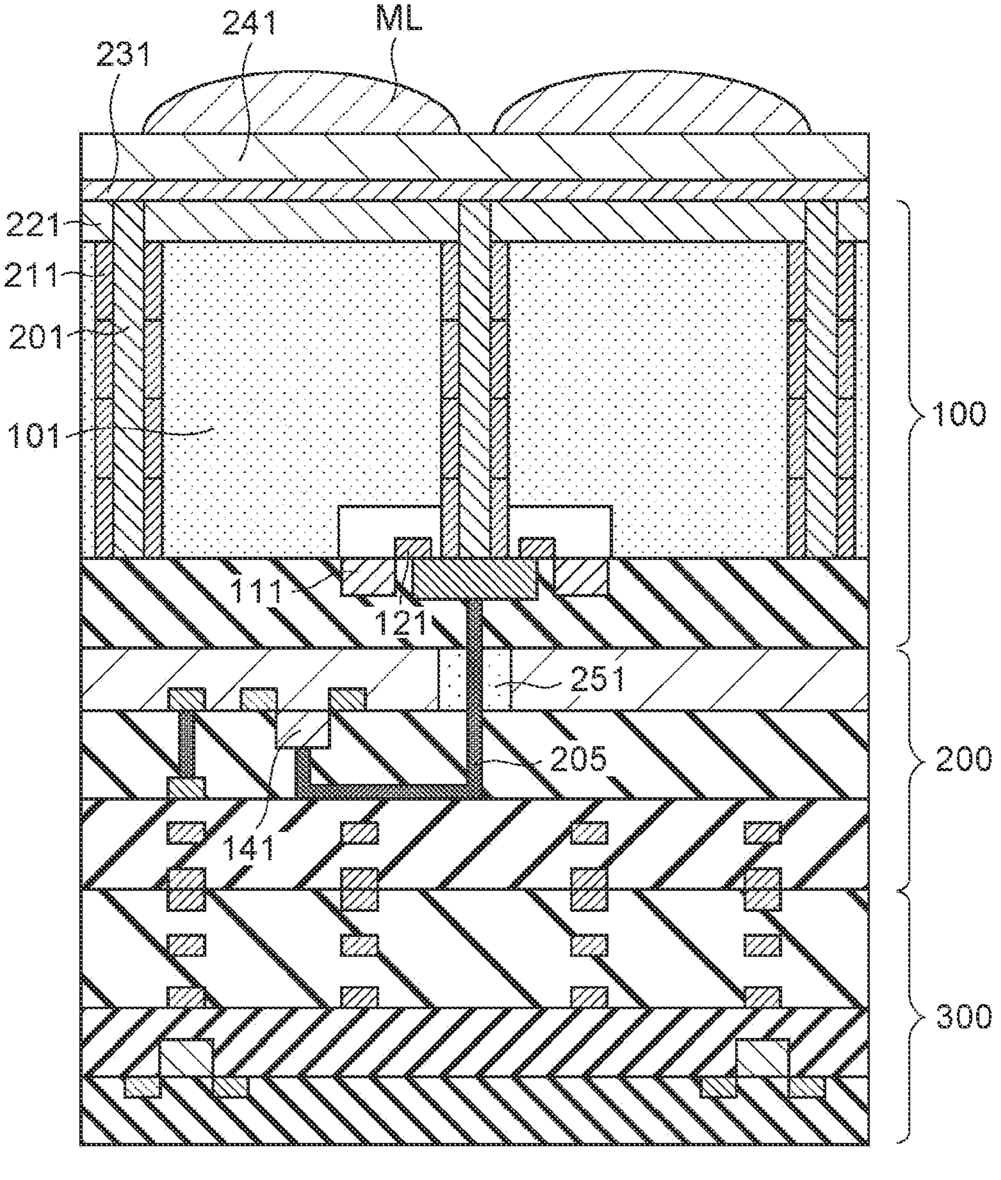
FIG. 4 is a sectional view of the photoelectric conversion device according to the first embodiment.

Alternatively, as illustrated in FIG. 4, one photodiode PD may be connected to one second FD node FD2. In a configuration illustrated in FIG. 4, one photodiode PD is connected to the gate 141 of the amplifier transistor AMP serving as one second FD node FD2. In FIG. 4, members with similar functions to those of the members illustrated in FIG. 3 are denoted by the same reference symbols, and description of those members is omitted.

Figure 5:
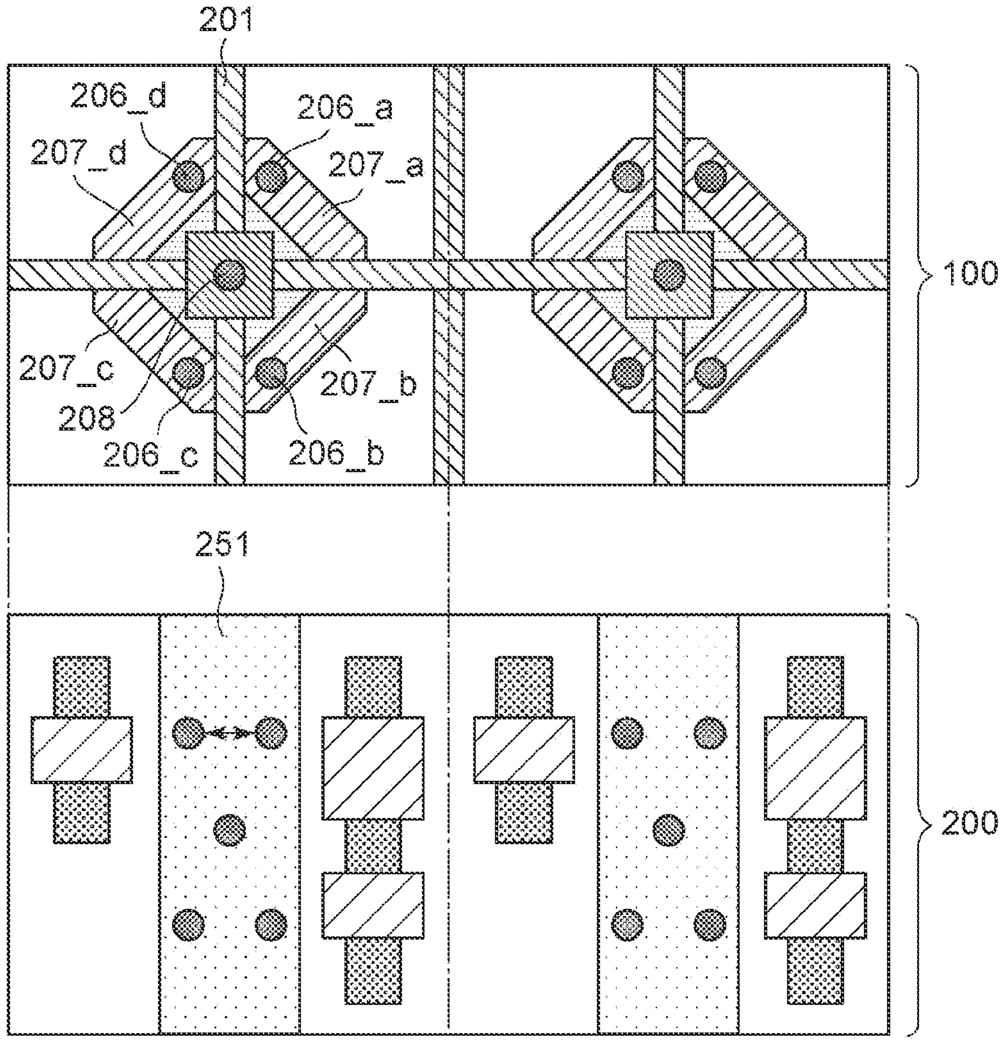
FIG. 5 is a plan view illustrating a comparative example with respect to the photoelectric conversion device according to the first embodiment.

FIG. 5 illustrates a comparative example indicating the first component and the second component in a plan view. FIG. 5 includes a plan view illustrating the first component 100 illustrated in FIG. 3 when viewed from a side including the second component 200 and a plan view illustrating the second component 200 when viewed from a side including the third component 300 on condition that a contact arrangement representing the comparative example is implemented in the photoelectric conversion device illustrated in FIGS. 2 to 4.

A polysilicon gate 207 corresponding to the gate of the transfer transistor TR is disposed on the second surface F2 of the first component 100. A contact 206 is connected to the polysilicon gate 207. The insulator 251 having a band shape and continuously spanning over multiple pixels is disposed in the second component, and the contact 206 is connected to the second component 200 by the conductor 205 penetrating through the insulator 251. A contact 208 connected to the second FD node FD2 is also connected to the second component 200 by the conductor 205 penetrating through the insulator 251.

Here, it is required to take a sufficient distance between the contacts from the viewpoint of preventing conduction between the contacts and propagation of change in potential. If the contacts are disposed away from each other to ensure a space between the contacts, a width (length in a short-length direction) of the insulator 251 is increased, and an area on the second component 200 in which pixel transistors are to be disposed is reduced.

Figure 6:
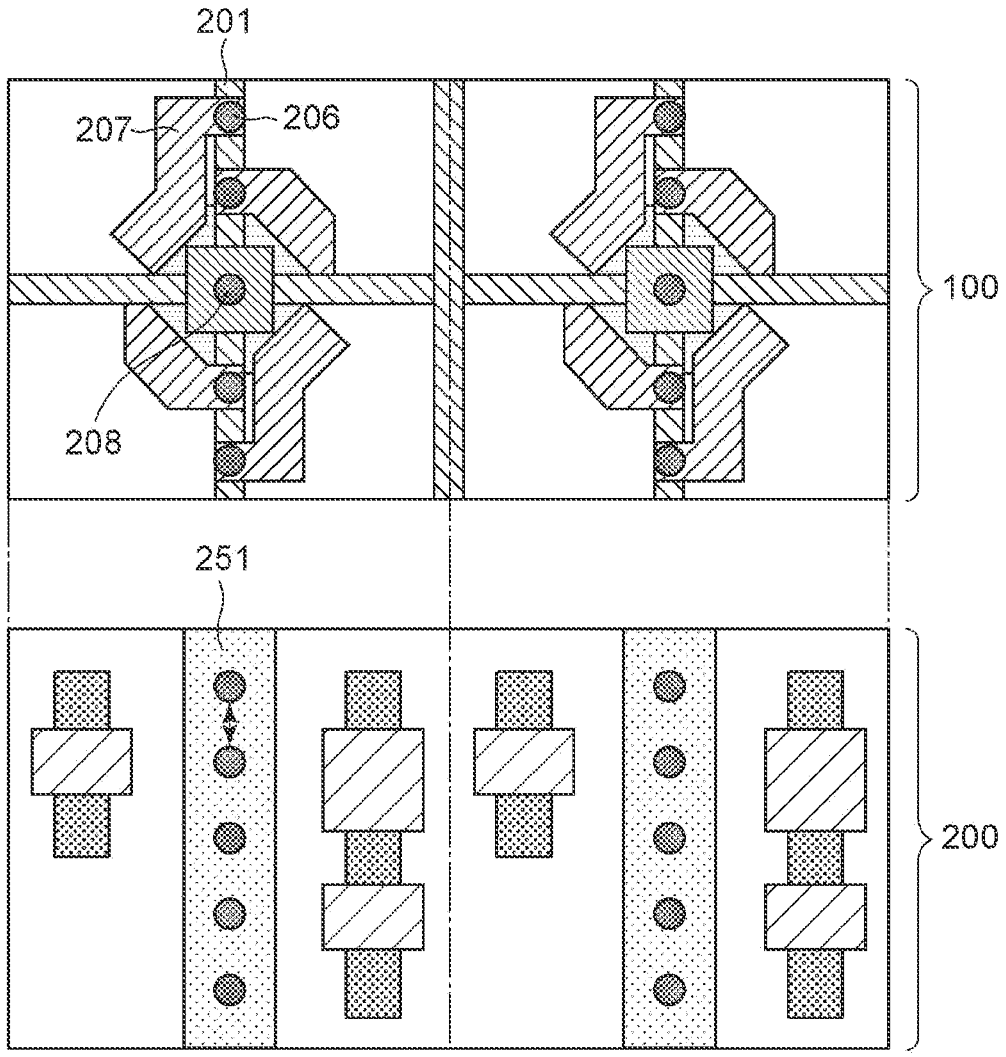
FIG. 6 is a plan view illustrating a comparative example with respect to the photoelectric conversion device according to the first embodiment.

FIG. 6 illustrates another comparative example indicating the first component 100 and the second component 200 in a plan view. FIG. 6 includes plan views of the first component 100 and the second component 200 when the contacts are arranged to lie on a straight line to avoid the width of the insulator 251 from increasing as in the comparative example illustrated in FIG. 5. In the arrangement illustrated in FIG. 6, the width of the insulator 251 can be reduced in comparison with the case illustrated in FIG. 5, but symmetry of the polysilicon gates 207 constituting the gates of the transfer transistors is reduced. This is because the transfer transistors TR connected to the four photodiodes have patterns of different shapes. The reduction in the symmetry of the polysilicon gates leads to a reduction in symmetry of transistor performance.

Figure 7:
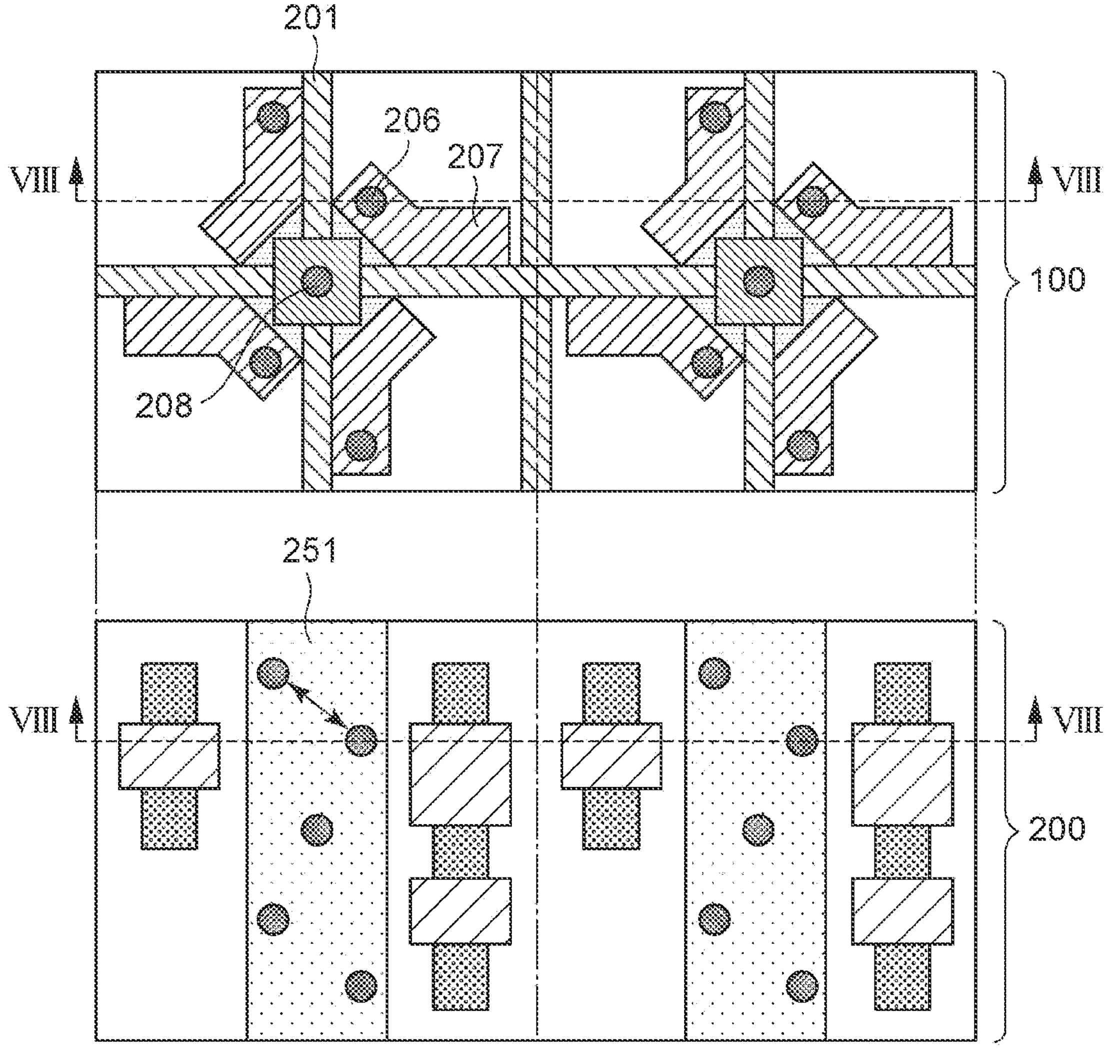
FIG. 7 is a plan view of the photoelectric conversion device according to the first embodiment.

FIG. 7 is a plan view illustrating the first component 100 and the second component 200 in this embodiment. In this embodiment, the contacts are arranged obliquely relative to a longitudinal direction of the insulator 251 disposed in the band shape.

Stated another way, a direction in which a first contact and a second contact among multiple contacts arranged on the second component 200 are aligned intersects the longitudinal direction of the insulator 251 at an acute angle. Thus, the direction in which the first contact and the second contact are aligned intersects the longitudinal direction of the insulator 251, but the former is not orthogonal to the latter.

With the above-mentioned arrangement, the width (length in the short-length direction) of the insulator 251 can be reduced, and the distance between the contacts can be ensured while the symmetry in shape of the polysilicon gates is maintained.

Figure 8:
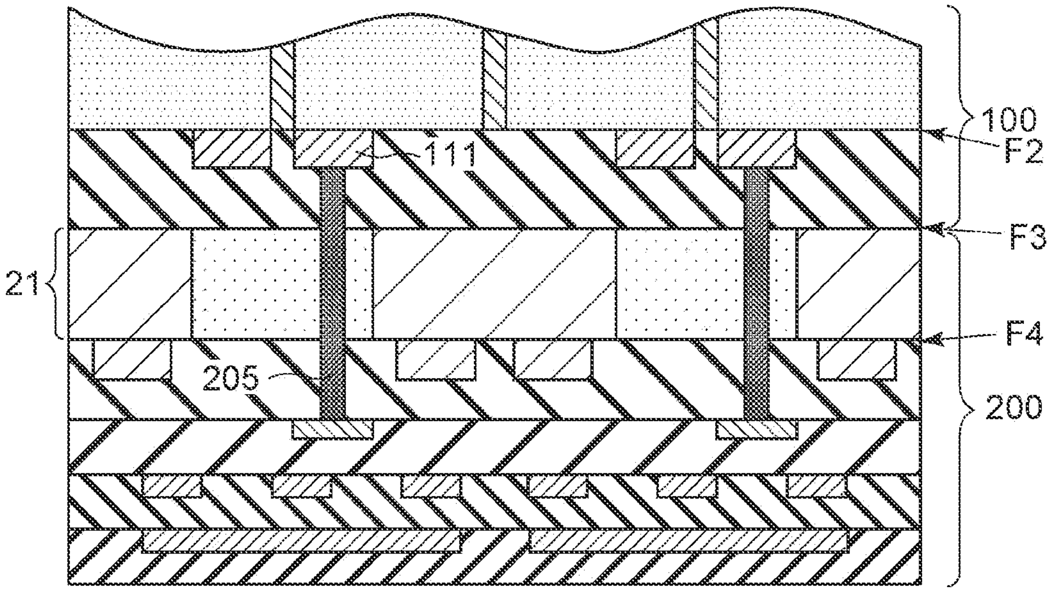
FIG. 8 is a sectional view of the photoelectric conversion device according to the first embodiment.

FIG. 8 is a sectional view of part of the first component 100 and the second component 200. A gate insulating film is disposed between the second surface F2 of the semiconductor substrate 14 and the transfer gate 111. The semiconductor substrate 21 has the third surface F3 and the fourth surface F4 opposite to the third surface F3. A gate insulating film is also disposed between the third surface F3 of the semiconductor substrate 21 and the gate 141 of the amplifier transistor AMP. A gate insulating film is further disposed between the third surface F3 of the semiconductor substrate 21 and the gate of the reset transistor RES. Similarly, a gate insulating film is disposed between the third surface F3 of the semiconductor substrate 21 and the gate of the selection transistor SEL.

The gate insulating films are each typically a film mainly containing silicon and oxygen, or a film mainly containing silicon and nitrogen. Thus, each gate insulating film may be a silicon oxide film, a silicon oxynitride film, or a silicon nitride film.

Second Embodiment

Regarding a second embodiment, a point different from the first embodiment is mainly described. The second embodiment is different from the first embodiment in an arrangement position of the contact on the polysilicon gate.

Figure 9:
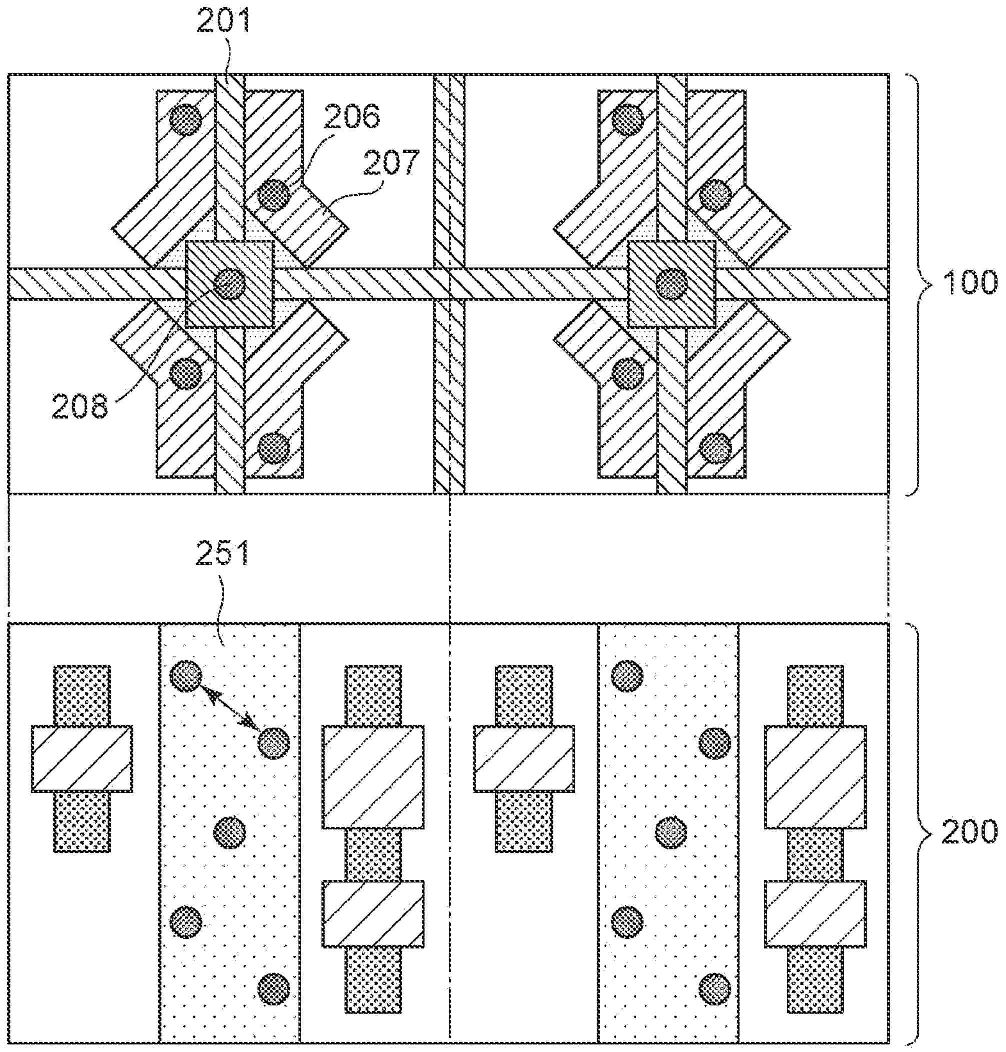
FIG. 9 is a plan view of a photoelectric conversion device according to a second embodiment.

FIG. 9 is a plan view illustrating the first component and the second component in this embodiment. In the above-described arrangement illustrated in FIG. 7, the polysilicon gates are disposed such that the contacts arranged at certain positions on the polysilicon gates are aligned obliquely relative to the insulator 251. In the arrangement illustrated in FIG. 9, however, the contacts are arranged to align obliquely relative to the insulator 251 on the polysilicon gates that are arranged at certain positions relative to the photoelectric conversion portions sharing the FD. In other words, while the polysilicon gates are arranged point-symmetrically in the arrangement illustrated in FIG. 7, the polysilicon gates are arranged line-symmetrically in the arrangement illustrated in FIG. 9.

The above-mentioned arrangement can be expected to provide an effect of reducing the influence of an alignment variation. In the arrangement illustrated in the first embodiment, the influence caused by the alignment variation in some direction exerts on all the four polysilicon gates that constitute the four transfer transistors TR sharing the FD.

On the other hand, in the arrangement illustrated in this embodiment, the influence caused by the alignment variation exerts on two of the four polysilicon gates that constitute the four transfer transistors TR sharing the FD.

For example, when the polysilicon gates are deviated in an up-down direction due to the alignment variation, characteristics are kept even between the polysilicon gates disposed on left and right sides in the arrangement of the contacts and the polysilicon gates according to this embodiment. This results in an effect of increasing resistance of characteristics in distance measurement to the alignment variation when the distance measurement is performed based on an image-surface phase difference by using multiple photoelectric conversion devices sharing the FD.

Third Embodiment

Regarding a third embodiment, a point different from the first embodiment and the second embodiment is mainly described. In the third embodiment, the pixel contacts sharing one FD are arranged in multiple insulators 251.

Figure 10:
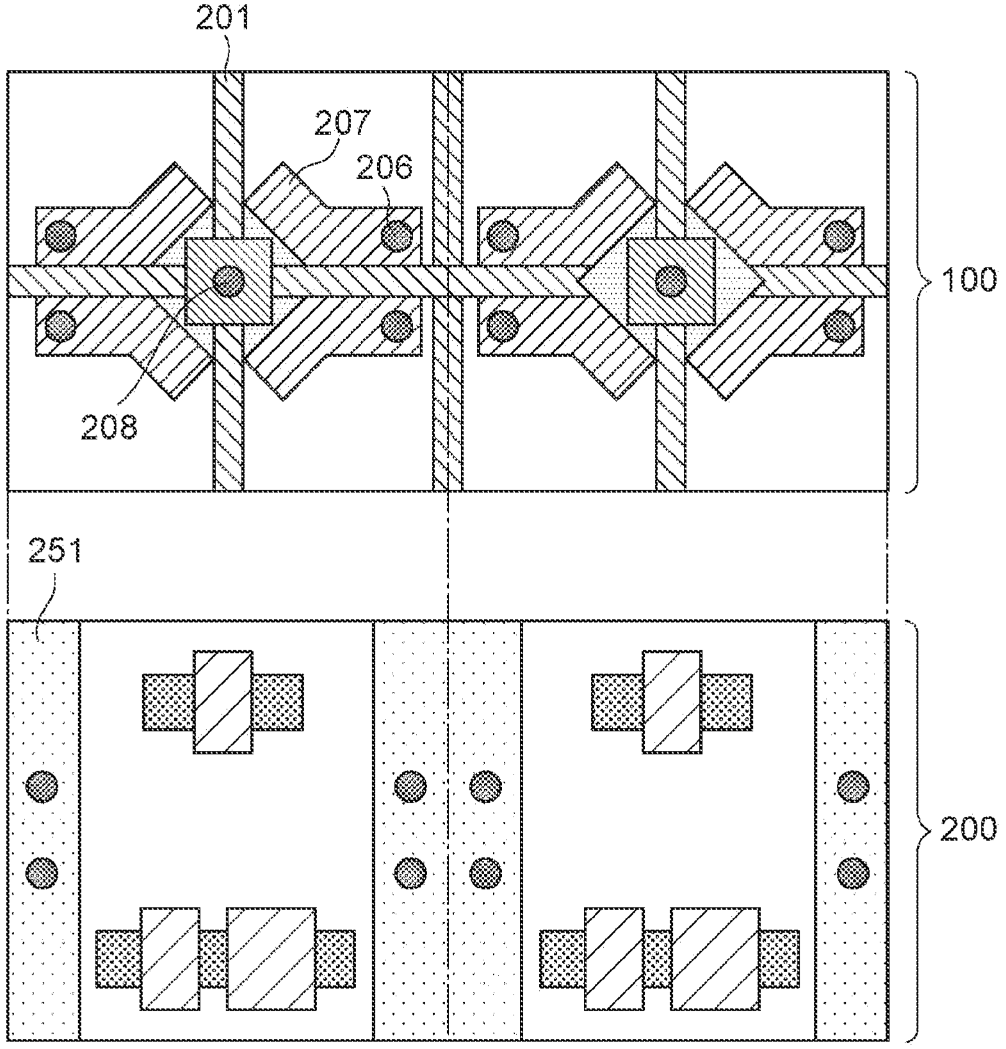
FIG. 10 is a plan view of a photoelectric conversion device according to a third embodiment.

FIG. 10 is a plan view illustrating the first component and the second component in this embodiment. Two insulators 251 of a band shape are disposed for four PDs sharing one FD, and two contacts are arranged in each of the insulators 251. Even with the above-described arrangement, since the shapes of the polysilicon gates are held uniform, a variation in transfer characteristics among the pixels can be reduced while the distance between the contacts is ensured.

Fourth Embodiment

Regarding a photoelectric conversion device according to a fourth embodiment, a point different from the first embodiment is mainly described.

In this embodiment, the contacts are arranged such that an array direction of the contacts is oblique relative to an array direction of a pixel array on the insulator 251.

Figure 11:
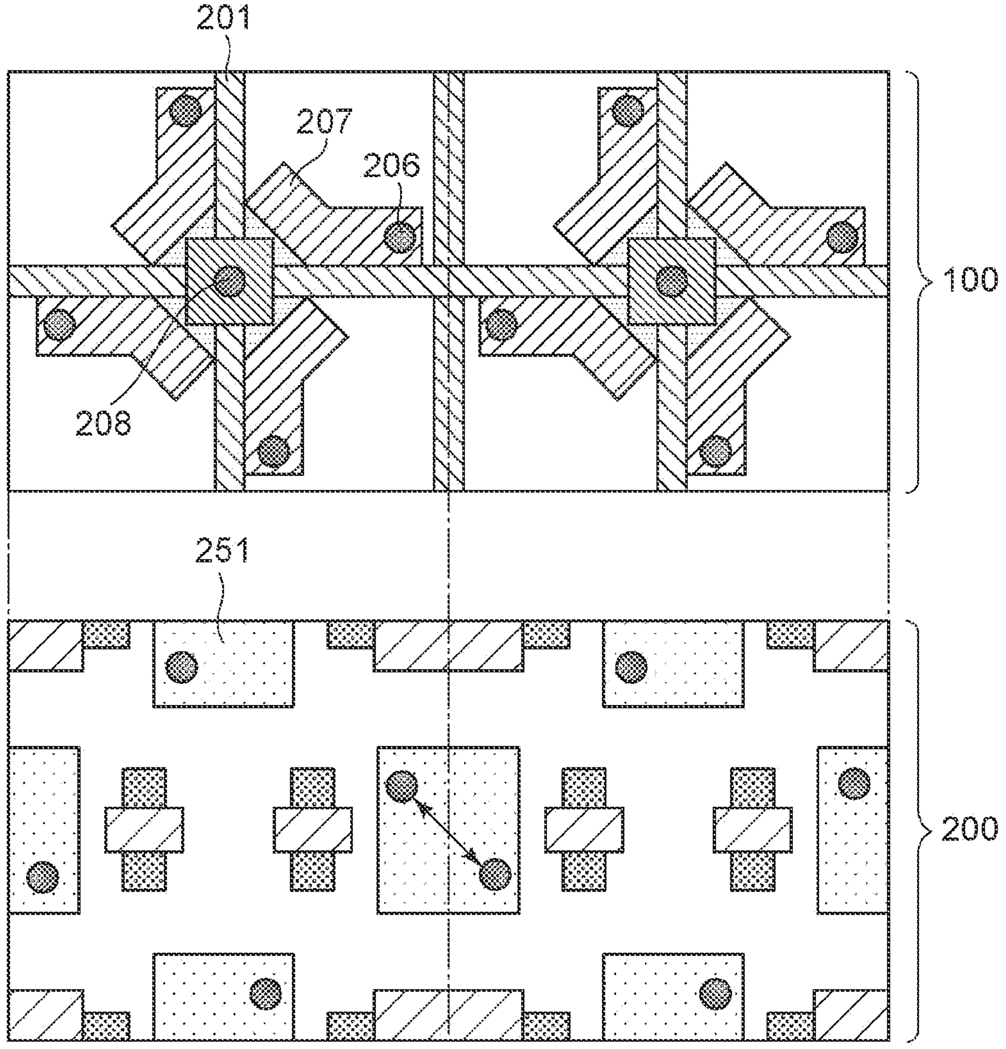
FIG. 11 is a plan view of a photoelectric conversion device according to a fourth embodiment.

FIG. 11 is a plan view illustrating the first component and the second component in this embodiment. In the second component 200 illustrated in FIG. 11, the insulator 251 of a rectangular shape is disposed. The shape of the insulator 251 is not limited to a rectangle and may be a polygonal or lattice shape. The number of the contacts disposed on each insulator 251 is not limited to the number, namely two, illustrated in FIG. 11.

In this embodiment, the contacts are aligned obliquely on the insulator 251 relative to the pixel array direction of the pixel array. With that arrangement, the distance between the contacts can be ensured while an area of the insulator 251 is reduced in comparison with the case in which the band-shaped insulator 251 is formed.

Fifth Embodiment

Regarding a photoelectric conversion device according to a fifth embodiment, a point different from the first embodiment is mainly described. This fifth embodiment is described in connection with a contact arrangement when the photoelectric conversion device includes distance measurement pixels sharing a microlens.

Figure 12:
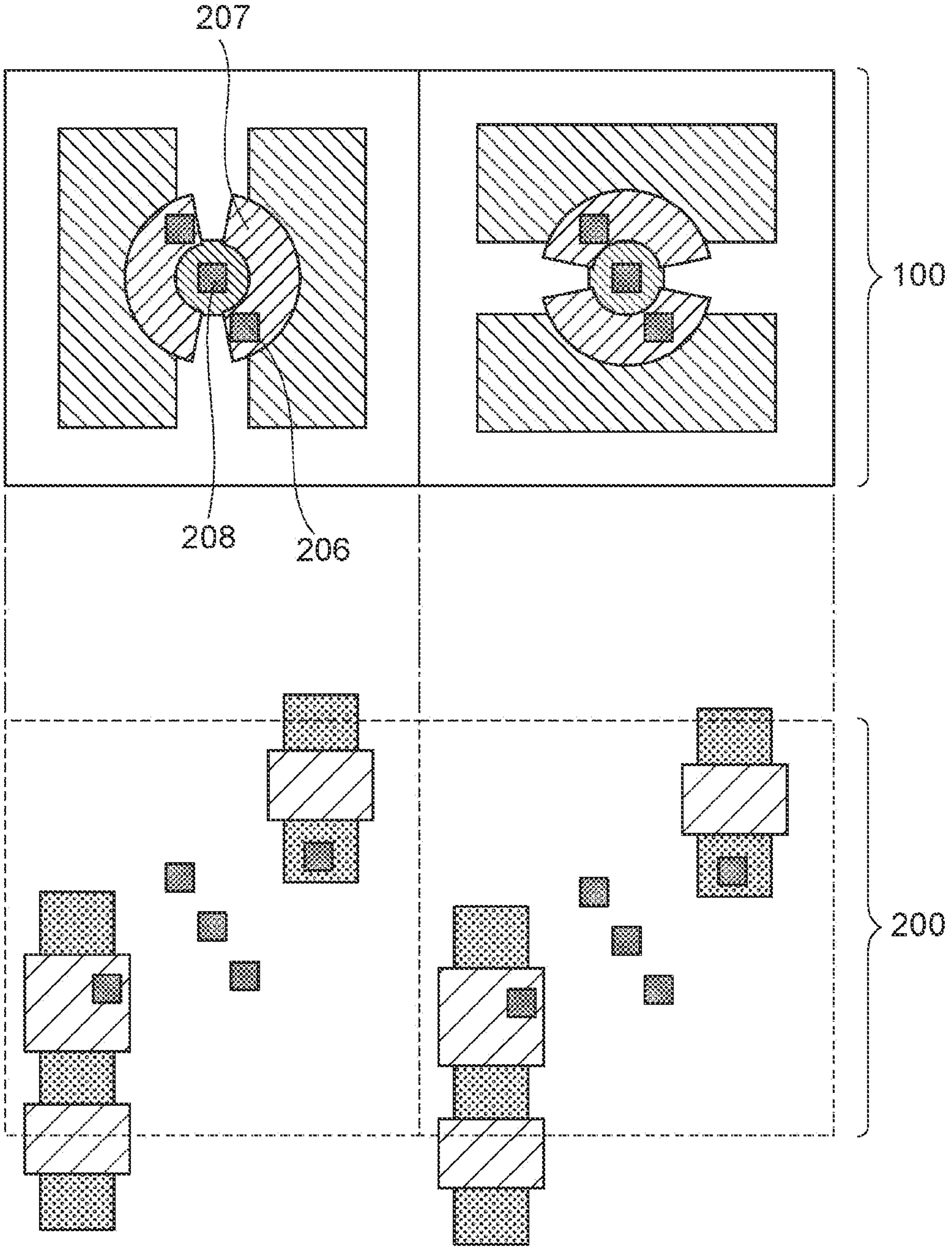
FIG. 12 is a plan view of a photoelectric conversion device according to a fifth embodiment.

FIG. 12 is a plan view illustrating the first component and the second component in this embodiment. The photoelectric conversion device according to this embodiment includes the distance measurement pixels. Each of the distance measurement pixels has a structure in which multiple divided photoelectric conversion portions share the microlens. A division direction of the photoelectric conversion portions does not need to be constant. In a configuration illustrated in FIG. 12, the photoelectric conversion device includes a first pixel including the photoelectric conversion portions divided in a first direction and a second pixel including the photoelectric conversion portions divided in a second direction that is 90 degrees different from the first direction. Because of including the distance measurement pixels different in the division direction of the photoelectric conversion portions, the distance measurement performance can be maintained even when an object moves in the same direction as the division direction of the photoelectric conversion portions in a certain pixel.

In FIG. 12, the contacts are arranged obliquely relative to the division direction of the photoelectric conversion portions in each of the pixels that are different in the division direction of the photoelectric conversion portions. In the illustrated arrangement, the contacts are disposed in the same arrangement regardless of the division direction of the photoelectric conversion portions. Two pixels share the polysilicon gate of the transfer transistor, and the photoelectric conversion portions divided in a vertical direction and the photoelectric conversion portions divided in a horizontal direction can be optionally used by rotating the photoelectric conversion portions through 90 degrees between the two pixels corresponding to the division direction of the photoelectric conversion portions. Accordingly, the contacts can be easily formed from the viewpoint of process, and a variation in transfer characteristics per pixel can be reduced.

Sixth Embodiment

Figure 13:
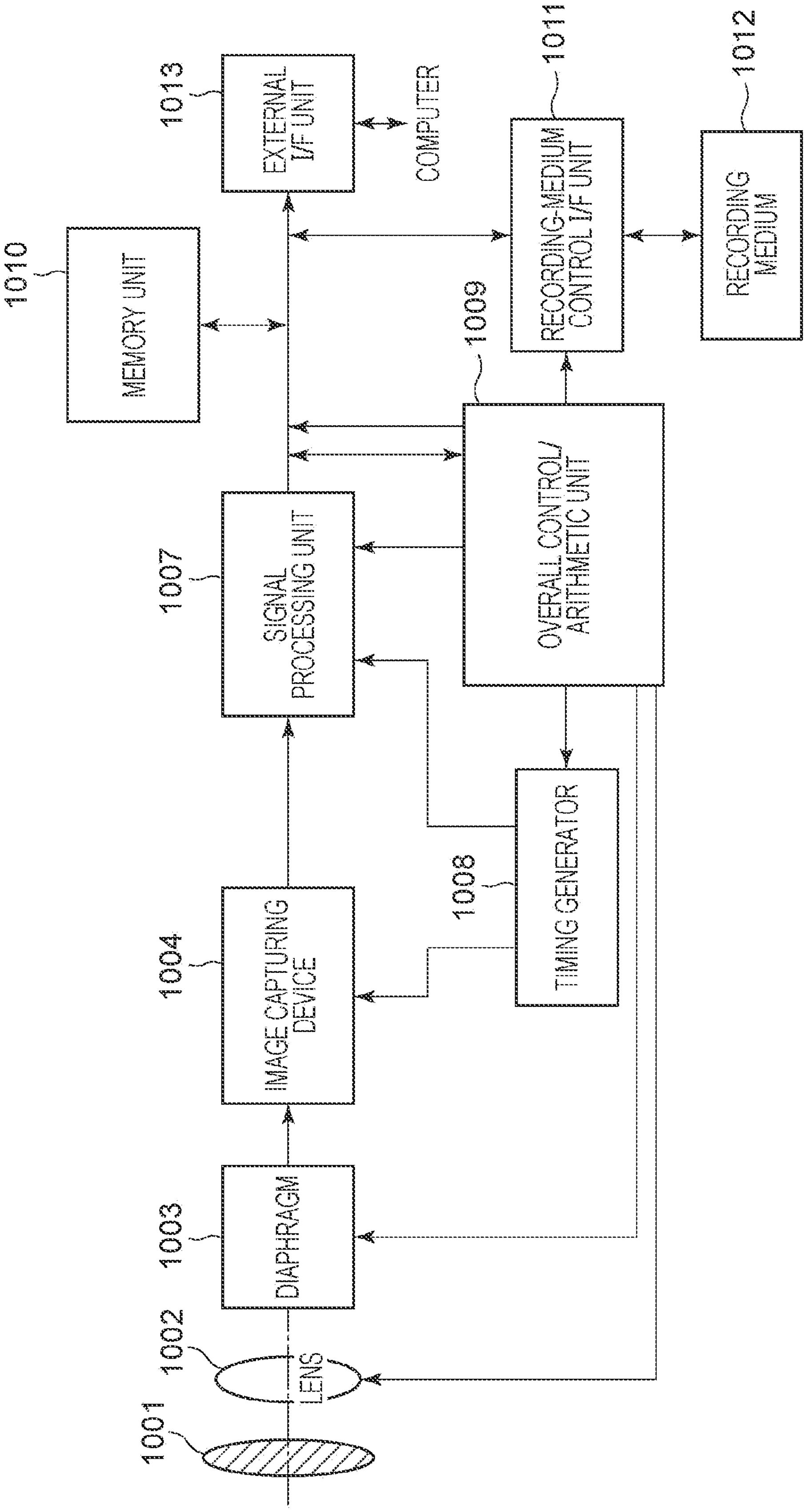
FIG. 13 is a functional block diagram of a photoelectric conversion system according to a sixth embodiment.

A photoelectric conversion system according to a sixth embodiment is described with reference to FIG. 13. FIG. 13 is a block diagram illustrating a schematic configuration of the photoelectric conversion system according to this embodiment.

The photoelectric conversion devices described above in the first to fifth embodiments can be applied to various types of photoelectric conversion systems. The photoelectric conversion systems to which the photoelectric conversion devices can be applied are, for example, a digital still camera, a digital cam coder, a monitoring camera, a copier, a facsimile, a mobile phone, an on-vehicle camera, and an observation satellite. A camera module including a lens system, such as an optical system, and an image capturing device also falls within the category of the photoelectric conversion system. FIG. 13 illustrates a block diagram of the digital still camera as an example of the above-mentioned photoelectric conversion systems.

The photoelectric conversion system illustrated in FIG. 13 includes an image capturing device 1004 as an example of the photoelectric conversion device and a lens 1002 arranged to focus an optical image of an object on the image capturing device 1004. The photoelectric conversion system further includes a diaphragm 1003 for varying a quantity of light passing through the lens 1002, and a barrier 1001 for protecting the lens 1002. The lens 1002 and the diaphragm 1003 constitute an optical system for collecting light onto the image capturing device 1004. The image capturing device 1004 is the photoelectric conversion device according to any one of the above-described embodiments and converts an optical image focused by the lens 1002 to an electric signal.

The photoelectric conversion system further includes a signal processing unit 1007, namely an image generator, configured to generate an image by processing an output signal from the image capturing device 1004. The signal processing unit 1007 executes an operation of outputting image data after performing various processes including correction and compression as required. The signal processing unit 1007 may be formed on a semiconductor substrate on which the image capturing device 1004 is disposed, or on another semiconductor substrate different from the substrate on which the image capturing device 1004 is disposed.

The photoelectric conversion system further includes a memory unit 1010 for temporarily storing the image data and an external interface unit (external I/F unit) 1013 through which communication with an external computer, for example, is performed. The photoelectric conversion system further includes a recording medium 1012, such as a semiconductor memory, for recording or reading the image data on or from the same and a recording-medium control interface unit (recording-medium control I/F unit) 1011 through which the image data is recorded on or read from the recording medium 1012. The recording medium 1012 may be incorporated in the photoelectric conversion system or may be removably attached to it.

In addition, the photoelectric conversion system includes an overall control/arithmetic unit 1009 configured to execute various types of arithmetic operations and to control the entirety of the digital still camera, and a timing generator 1008 configured to output various timing signals to the image capturing device 1004 and the signal processing unit 1007. Here, the timing signals and so on may be input from the outside. Thus, the photoelectric conversion system merely needs to include at least the image capturing device 1004 and the signal processing unit 1007 configured to process the output signal from the image capturing device 1004.

The image capturing device 1004 outputs the image signal to the signal processing unit 1007. The signal processing unit 1007 executes predetermined signal processing on the image signal output from the image capturing device 1004 and outputs the image data. The signal processing unit 1007 generates an image based on the image data.

As seen from the above discussion, this embodiment can realize the photoelectric conversion system to which the photoelectric conversion device (the image capturing device) according to any one of the above-described embodiments is applied.

Seventh Embodiment

Figure 14A:
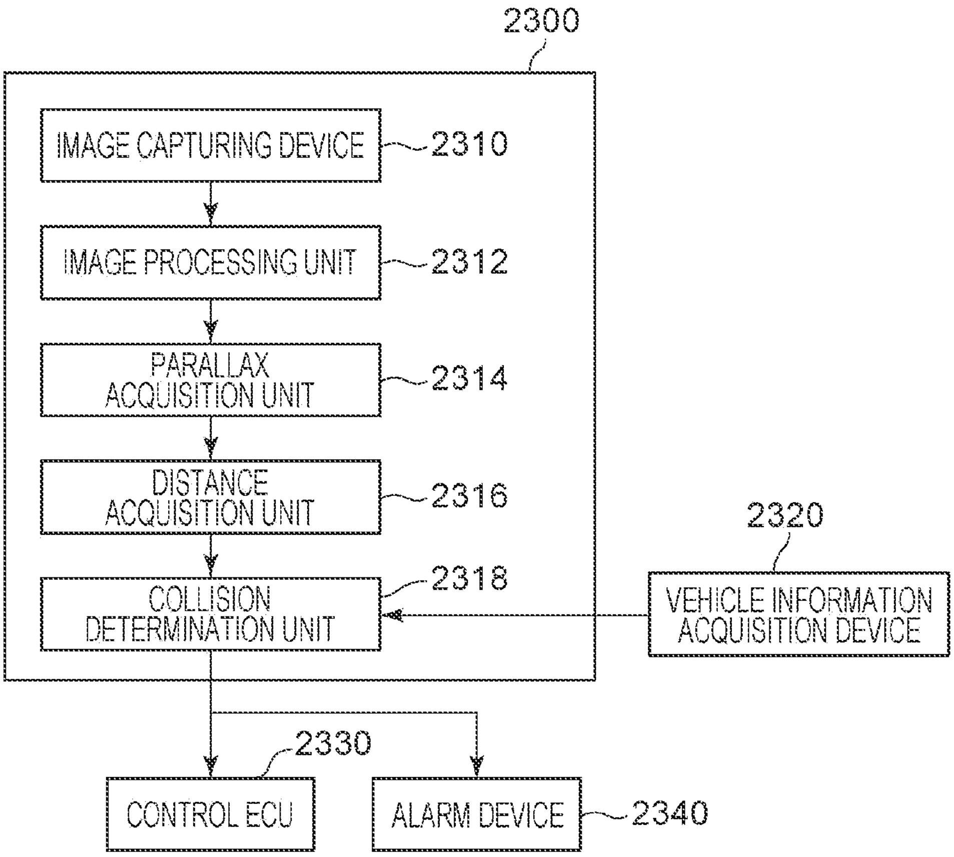
FIGS. 14A and 14B are functional block diagrams of a photoelectric conversion system and a moving body according to a seventh embodiment.
Figure 14B:
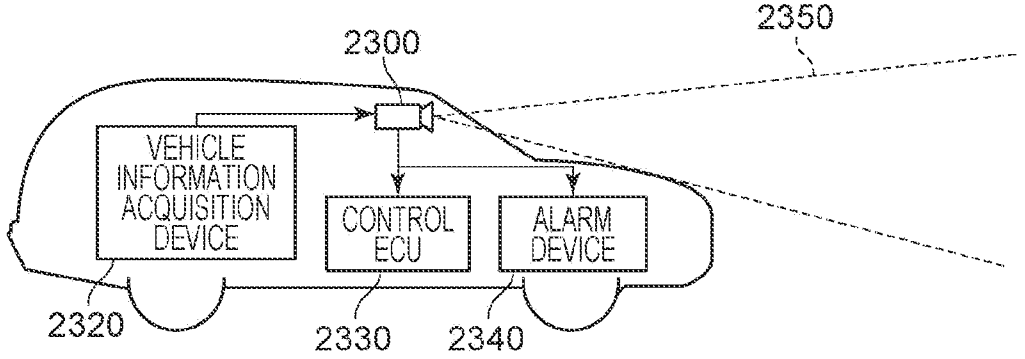

A photoelectric conversion system and a moving body according to a seventh embodiment is described with reference to FIGS. 14A and 14B. FIGS. 14A and 14B illustrate, respectively, schematic configurations of the photoelectric conversion system and the moving body according to this embodiment.

FIG. 14A illustrates an example of a photoelectric conversion system 2300 related to an on-vehicle camera. The photoelectric conversion system 2300 includes an image capturing device 2310. The image capturing device 2310 is the photoelectric conversion device that is any one of the above-described embodiments. The photoelectric conversion system 2300 includes an image processing unit 2312 configured to execute image processing on multiple sets of image data acquired from the image capturing device 2310, and a parallax acquisition unit 2314 configured to calculate a parallax (phase difference between parallax images) from the multiple sets of image data acquired from the image capturing device 2310. The photoelectric conversion system 2300 further includes a distance acquisition unit 2316 configured to calculate a distance up to a target object based on the calculated parallax, and a collision determination unit 2318 configured to determine, based on the calculated distance, whether there is a possibility of collision. Here, the parallax acquisition unit 2314 and the distance acquisition unit 2316 are an example of a distance information acquisition unit configured to acquire distance information for the target object. In other words, the distance information is information related to the parallax, a defocus amount, the distance up to the target object, and so on. The collision determination unit 2318 may determine the possibility of collision based on any of the above-mentioned examples of the distance information. A distance information acquisition unit may be implemented by dedicatedly designed hardware or by a software module.

Alternatively, the distance information acquisition unit may be implemented by an FPGA (Field Programmable Gate Array) or an ASIC (Application Specific Integrated Circuit), for example, or by a combination of the formers.

The photoelectric conversion system 2300 is connected to a vehicle information acquisition device 2320 and can acquire vehicle information such as a vehicle speed, a yaw rate, and a steering angle. The photoelectric conversion system 2300 is further connected to a control ECU 2330, namely a control unit, configured to output a control signal instructing a vehicle to generate a braking force based on the determination result of the collision determination unit 2318. In addition, the photoelectric conversion system 2300 is connected to an alarm device 2340 configured to issue an alarm to a driver based on the determination result of the collision determination unit 2318. For example, when the determination result of the collision determination unit 2318 indicates that the possibility of collision is high, the control ECU 2330 executes vehicle control of avoiding the collision or reducing damage by, for example, applying the brake, returning an accelerator, or suppressing an engine output. The alarm device 2340 gives warning to a user by, for example, issuing an alarm such as sounds, displaying alarm information on a screen of a car navigation system or the like, or applying vibration to a sheet belt or a steering wheel.

In this embodiment, the photoelectric conversion system 2300 captures an image of the surrounding, for example, the front or the back, of the vehicle. FIG. 14B illustrates the photoelectric conversion system in the case of capturing the image in the front of the vehicle (in an image capturing area 2350). The vehicle information acquisition device 2320 sends an instruction to the photoelectric conversion system 2300 or the image capturing device 2310. With the above-described configuration, accuracy in the distance measurement can be improved.

While the above description is made in connection with an example in which the control is executed in a manner of not causing collision with another vehicle, the present disclosure can also be applied to, for example, the case of executing auto-cruising control to follow another vehicle or to avoid the vehicle from rolling out of the lane. The photoelectric conversion system can be further applied to another moving body (moving device), such as a ship, an aircraft, or an industrial robot, without being limited to the vehicle such as an automobile. Moreover, the photoelectric conversion system can be applied to equipment utilizing recognition of an object in a broad sense, such as an intelligent transport system (ITS), without being limited to the moving body.

Eighth Embodiment

Figure 15:
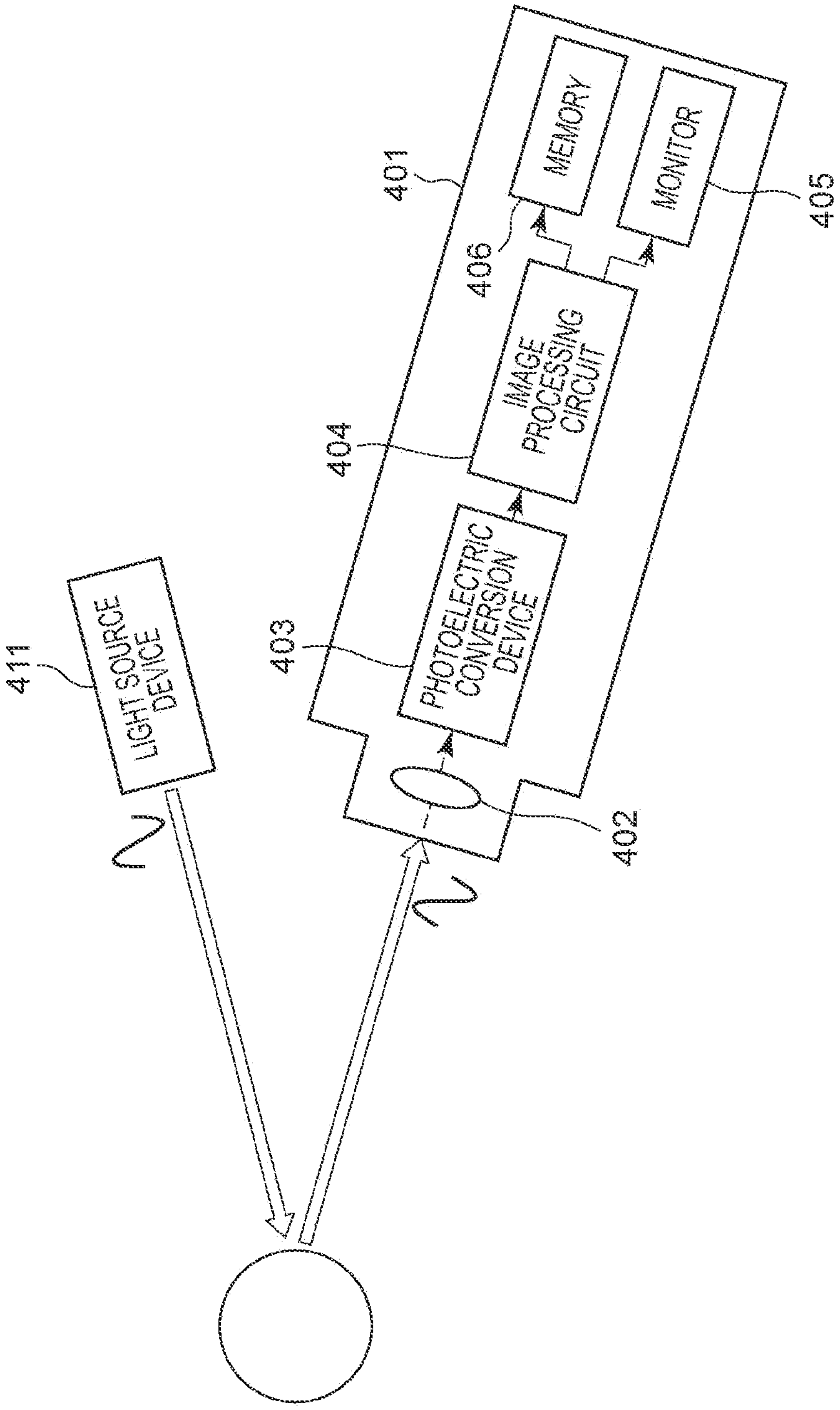
FIG. 15 is a functional block diagram of a photoelectric conversion system according to an eighth embodiment.

A photoelectric conversion system according to an eighth embodiment is described with reference to FIG. 15. FIG. 15 is a block diagram illustrating an example of a configuration of a distance image sensor that represents the photoelectric conversion system according to this embodiment.

As illustrated in FIG. 15, the distance image sensor 401 includes an optical system 407, a photoelectric conversion device 408, an image processing circuit 404, a monitor 405, and a memory 406. The distance image sensor 401 can acquire a distance image corresponding to a distance up to an object by applying light from a light source device 411 to the object and by receiving light (modulated light or pulsed light) reflected by a surface of the object.

The optical system 407 is constituted by one or multiple lenses and guides image light (incident light) from the object to the photoelectric conversion device 408 such that the image light is focused on a light receiving surface (sensor portion) of the photoelectric conversion device 408.

The photoelectric conversion device according to any one of the above-described embodiments is used as the photoelectric conversion device 408, and a distance signal representing the distance calculated from a received-light signal, output from the photoelectric conversion device 408, is supplied to the image processing circuit 404.

The image processing circuit 404 executes, based on the distance signal supplied from the photoelectric conversion device 408, image processing to construct a distance image. The distance image (image data) obtained from the image processing is supplied to the monitor 405 to be displayed on it or supplied to the memory 406 to be stored (recorded) in it.

According to the thus-constituted distance image sensor 401, because of including the above-described photoelectric conversion device, it is possible to improve pixel characteristics and to acquire the distance image with higher accuracy, for example.

Ninth Embodiment

Figure 16:
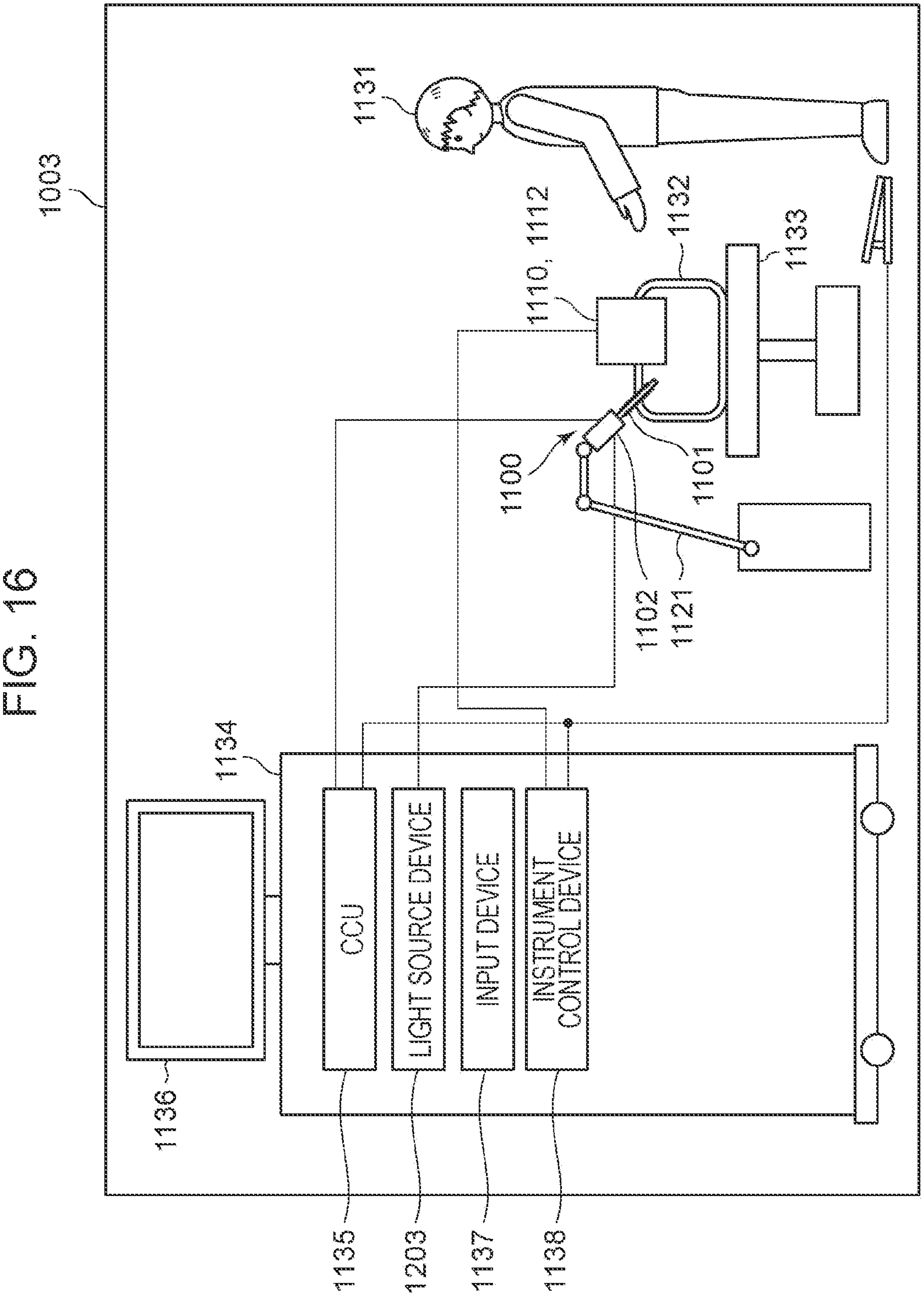
FIG. 16 is a functional block diagram of a photoelectric conversion system according to a ninth embodiment.

A photoelectric conversion system according to a ninth embodiment is described with reference to FIG. 16. FIG. 16 is a block diagram illustrating a schematic configuration of an endoscope surgery system that represents the photoelectric conversion system according to this embodiment.

FIG. 16 illustrates a situation in which a surgeon (doctor) 1131 is performing surgery on a patient 1132 lying on a patient bed 1133 by using an endoscope surgery system 1150. As illustrated, the endoscope surgery system 1150 is constituted by an endoscope 1100, a surgical instrument 1110, and a cart 1134 on which various devices for performing the endoscope surgery are placed.

The endoscope 1100 is constituted by a lens barrel 1101, a partial region of the lens barrel 1101 spanning over a predetermined length from a tip end being inserted into a body cavity of the patient 1132, and by a camera head 1102 connected to a base end of the lens barrel 1101. While an illustrated example indicates the endoscope 1100 that is the so-called hard endoscope including the hard lens barrel 1101, the endoscope 1100 may be constituted as the so-called flexible endoscope including a flexible lens barrel.

An opening is formed at the tip end of the lens barrel 1101, and an objective lens is fitted to the opening. A light source device 1203 is connected to the endoscope 1100. Light emitted from the light source device 1203 is guided up to the tip end of the lens barrel by a light guide extending inside the lens barrel 1101 and is applied to an observation target inside the body cavity of the patient 1132 through the objective lens. The endoscope 1100 may be a direct-viewing endoscope, an oblique-viewing endoscope, or a side-viewing endoscope.

An optical system and a photoelectric conversion device are disposed inside the camera head 1102, and reflected light (observation light) from the observation target is collected onto the photoelectric conversion device through the optical system. The observation light is photoelectrically converted by the photoelectric conversion device, and an electric signal corresponding to the observation light, namely an image signal corresponding to an image of the observation target, is generated. The photoelectric conversion device may be the photoelectric conversion device according to any one of the above-described embodiments. The image signal is transmitted as RAW data to a CCU (Camera Control Unit) 1135.

The CCU 1135 is constituted by a CPU (Central Processing Unit) or a GPU (Graphics Processing Unit), for example, and controls operations of the endoscope 1100 and a display device 1136 in a supervising fashion. Furthermore, the CCU 1135 receives the image signal from the camera head 1102 and executes various types of image processing, such as a development process (demosaic process), on the received image signal to display an image based on the processed image signal.

The display device 1136 displays, under control of the CCU 1135, the image based on the image signal after being subjected to the image processing by the CCU 1135.

The light source device 1203 is constituted by a light source, for example, a LED (Light Emitting Diode) and supplies, to the endoscope 1100, illumination light to capture, for example, an image of a surgical site.

An input device 1137 serves as an input interface with respect to the endoscope surgery system 1150. A user can input various types of information or instructions to the endoscope surgery system 1150 through the input device 1137.

An instrument control device 1138 controls driving of an energy appliance 1112 that is used to, for example, cauterize or incise tissues or seal blood vessels.

The light source device 1203 for supplying, to the endoscope 1100, the illumination light to capture the image of the surgical site can be constituted by, for example, a LED, a laser light source, or a white light source in a combination of multiple units of the former examples. When the white light source is constituted by a combination of RGB laser light sources, white balance of a captured image can be adjusted by the light source device 1203 because output intensity and output timing of each color (each wavelength) can be controlled with high accuracy. In such a case, by applying laser lights from RGB laser light sources to the observation target in a time-sharing manner and by controlling driving of image capturing elements of the camera head 1102 in synchronism with the irradiation timing, images corresponding to RGB can also be captured in the time-sharing manner. According to the above-mentioned method, a color image can be obtained without disposing color filters on the image capturing elements.

Driving of the light source device 1203 may be controlled such that the intensity of the light output from the light source device 1203 is changed per predetermined time. An image with a high dynamic range free from the so-called black underexposure image and blown-out highlights can be generated by controlling the driving of the image capturing elements of the camera head 1102 in synchronism with the timing in change of the intensity of the output light, obtaining images in the time-sharing manner, and by synthesizing the obtained images.

Furthermore, the light source device 1203 may be constituted to be able to supply light in a predetermined wavelength range adapted for special light observation. In the special light observation, for example, wavelength dependency of light absorption in a body tissue is utilized. In more detail, an image of a predetermined tissue, such as a blood vessel in the mucosal surface, is captured with high contrast by applying irradiation light in a narrower range than the irradiation light (namely, white light) used in ordinary observation.

Alternatively, in the special light observation, fluorescence observation may be performed to obtain an image from fluorescence that is generated upon irradiation with excitation light. In the fluorescence observation, it is possible to, for example, observe fluorescence from a body tissue by irradiating the body tissue with the excitation light, or to obtain a fluorescence image by locally injecting a reagent, such as indo-cyanine green (ICG), to a body tissue, and by irradiating the body tissue with the excitation light corresponding to a fluorescence wavelength of the reagent. The light source device 1203 can be constituted to be able to supply the narrow-range light and/or the excitation light adapted for the above-described special light observation.

Tenth Embodiment

Figure 17A:
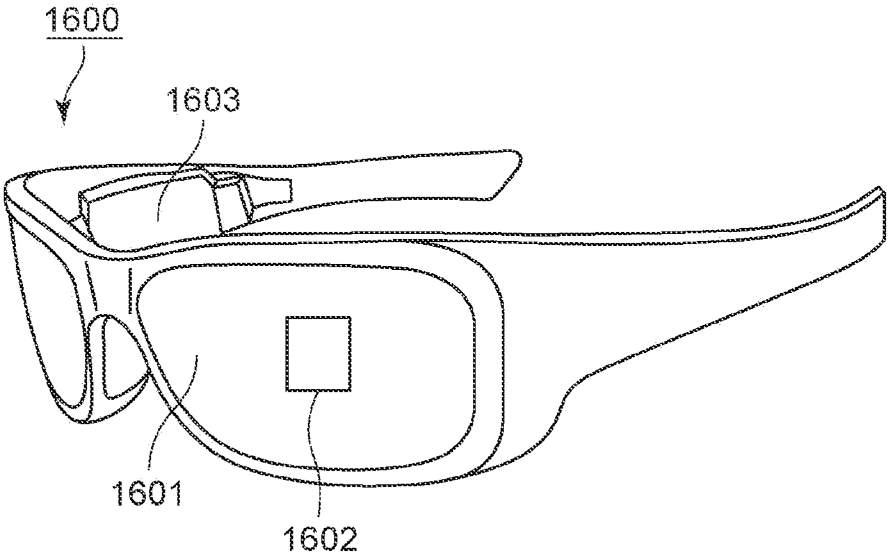
FIGS. 17A and 17B are schematic views of a photoelectric conversion system according to a tenth embodiment.

A photoelectric conversion system according to a tenth embodiment is described with reference to FIGS. 17A and 17B. FIG. 17A illustrates a pair of eyeglasses 1600 (smart glasses) that represents the photoelectric conversion system according to this embodiment. The pair of eyeglasses 1600 includes a photoelectric conversion device 1602. The photoelectric conversion device 1602 is the photoelectric conversion device according to any one of the above-described embodiments. A display device including a light emitting device, such as an OLED or a LED, may be disposed on a rear side of a lens 1601. One or more photoelectric conversion devices 1602 may be disposed. Multiple types of photoelectric conversion devices may be used in a combination. An arrangement position of the photoelectric conversion device 1602 is not limited to that illustrated in FIG. 17A.

The pair of eyeglasses 1600 further includes a control device 1603. The control device 1603 functions as a power supply for supplying electric power to the photoelectric conversion device 1602 and the display device. The control device 1603 controls operations of the photoelectric conversion device 1602 and the display device. An optical system for collecting light to the photoelectric conversion device 1602 is formed on the lens 1601.

Figure 17B:
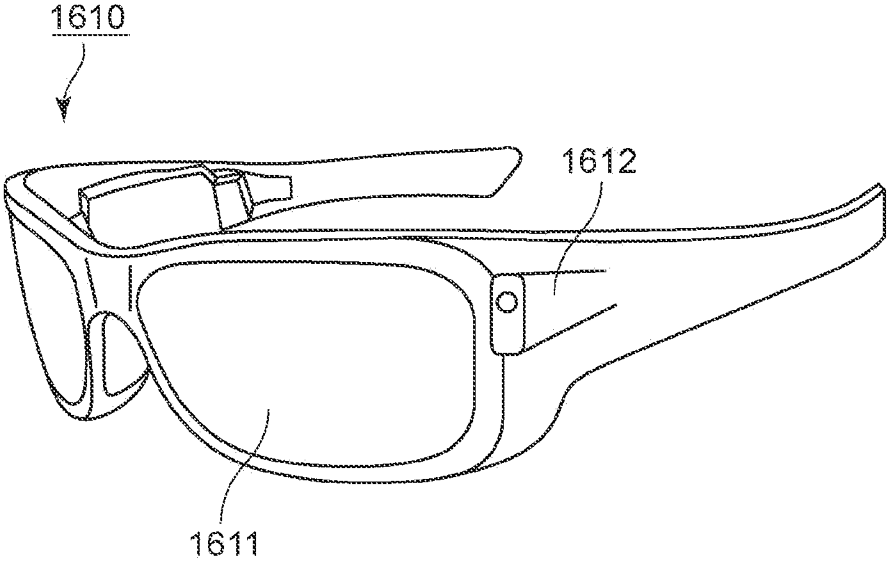

FIG. 17B illustrates a pair of eyeglasses 1610 (smart glasses) according to one application example. The pair of eyeglasses 1610 includes a control device 1612. A photoelectric conversion device corresponding to the photoelectric conversion device 1602 and the display device are incorporated in the control device 1612. Optical systems for collecting light onto the photoelectric conversion device in the control device 1612 and for projecting light emission from the display device are formed on the lens 1611, and an image is projected onto the lens 1611. The control device 1612 functions as a power supply for supplying electric power to the photoelectric conversion device and the display device and further controls operations of the photoelectric conversion device and the display device. The control device may include a visual line sensor for sensing a visual line of a wearer. An infrared light may be used to sense the visual line. An infrared emitter emits the infrared light to the eyeball of a user looking at the displayed image. An eyeball image can be obtained by detecting reflected light of the emitted infrared light from the eyeball with an image capturing portion including light receiving elements. A reduction in image quality is suppressed with the provision of a unit for reducing the light entering a display portion from the infrared emitter in a plan view.

The visual line of the user with respect to the displayed image is detected from the eyeball image captured using the infrared light. Any suitable one of known methods can be used to detect the visual line based on the captured eyeball image. In an example, a visual line detection method based on a Purkinje image formed by reflection of irradiation light at the cornea can be used.

In more detail, a visual line detection process based on a pupillary cornea reflection method is performed. With the pupillary cornea reflection method, a visual line vector representing an orientation (rotation angle) of the eyeball is calculated based on a pupil image and the Purkinje image that are both included in the captured eyeball image. As a result, the visual line of the user is detected.

The display device in this embodiment may include a photoelectric conversion device including light receiving elements and may control an image displayed by the display device in accordance with visual line information of the user, the visual line information being obtained from the photoelectric conversion device.

More specifically, in the display device, a first visual-field region at which the user is looking and a second visual-field region other than the first visual-field region are determined based on the visual line information. The first visual-field region and the second visual-field region may be determined by the control device for the display device. Alternatively, the first visual-field region and the second visual-field region may be obtained by receiving those regions that have been determined by an external control device. In a display region of the display device, a display resolution in the first visual-field region may be set to be higher than that in the second visual-field region. In other words, a display resolution in the second visual-field region may be set to be lower than that in the first visual-field region.

The display region may include a first display region and a second display region different from the first display region, and which one of the first display region and the second display region has higher priority may be determined based on the visual line information. The first display region and the second display region may be determined by the control device for the display device. Alternatively, the first display region and the second display region may be obtained by receiving those regions that have been determined by an external control device. A resolution in the higher priority region may be controlled to be higher than that in the region other than the higher priority region. In other words, a lower resolution may be given to the region with relatively low priority.

AI may be used to determine the first visual-field region or the other region with higher priority. The AI may be a model that is configured to estimate, from the eyeball image, an angle of the visual line and a distance up to an object to which the visual line is directed, by utilizing, as teacher data, the eyeball image and a direction in which the eyeball in the image is actually viewing. An AI program may be stored in the display device, the photoelectric conversion device, or an external device. When the AI program is stored in the external device, it is transmitted to the display device via communication.

In trying to perform display control based on detection with visual recognition, smart glasses further including a photoelectric conversion device configured to capture an external image can be preferably applied. The smart glasses can display the captured external information in real time.

Modified Embodiments

The present disclosure is not limited to the above-described embodiments and can be variously modified.

For example, a modification in which part of the configuration of any one of the embodiments is added to another embodiment, and a modification in which part of the configuration of any one of the embodiments is replaced with part of another embodiment also fall within the embodiments of the present disclosure.

The photoelectric conversion systems described in the above sixth and seventh embodiments are examples of the photoelectric conversion system to which the photoelectric conversion device according to the present disclosure can be applied, and the photoelectric conversion system to which the photoelectric conversion device according to the present disclosure can be applied is not limited to the configurations illustrated in FIGS. 13 and 14. The above point is similarly applied to the ToF system described in the eighth embodiment, the endoscope described in the ninth embodiment, and the smart glasses described in the tenth embodiment.

Any of the above-described embodiments merely illustrates a concrete example in implementing the present disclosure, and the technical scope of the present disclosure is not to be interpreted in a restrictive sense. Thus, the present disclosure can be implemented in various forms without departing from the technical concept or the main features of the present disclosure.

The proper arrangement of the contact connected to the transistor disposed on the first semiconductor substrate and the contact connected to the transistor disposed on the second semiconductor substrate can be realized.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-171846, filed Oct. 26, 2022, which is hereby incorporated by reference herein in its entirety.

What is claimed is:

1. A photoelectric conversion device comprising:
a first component comprising:
- a first semiconductor substrate having a first surface and a second surface opposite to the first surface;
- a first photoelectric conversion portion arranged to receive light from the second surface;
- a second photoelectric conversion portion arranged to receive light from the second surface;
- a floating diffusion portion; and a first transfer gate disposed on a side including the first surface and transferring signal charges generated in the first photoelectric conversion portion to the floating diffusion portion, and a second transfer gate disposed on the side including the first surface and transferring signal charges generated in the second photoelectric conversion portion to the floating diffusion portion, and a second component comprising:

a second semiconductor substrate having a third surface and a fourth surface opposite to the third surface; and an insulator having a band shape and filled into a through-hole formed in the second semiconductor substrate, the second component and the first component being laminated to each other, wherein the insulator includes a first contact connected to the first transfer gate and a second contact connected to the second transfer gate, the second contact being positioned closest to the first contact, and a direction in which the first contact and the second contact are aligned intersects a longitudinal direction of the insulator at an acute angle.

2. The photoelectric conversion device according to claim 1, wherein the first transfer gate and the second transfer gate are line-symmetric with respect to the longitudinal direction in a plan view.

3. The photoelectric conversion device according to claim 1, wherein the first transfer gate and the second transfer gate are made of polysilicon.

4. A photoelectric conversion system comprising:

the photoelectric conversion device according to claim 1; and a signal processing unit configured to generate an image based on a signal output from the photoelectric conversion device.

5. A moving body comprising:

the photoelectric conversion device according to claim 1, wherein the moving body includes a control unit configured to control movement of the moving body based on a signal output from the photoelectric conversion device.

6. A photoelectric conversion device comprising:

a first component comprising:

a first semiconductor substrate having a first surface and a second surface opposite to the first surface;

a first photoelectric conversion portion arranged to receive light from the second surface;

a second photoelectric conversion portion arranged to receive light from the second surface;

a first transfer gate disposed on a side including the first surface and transferring signal charges generated in the first photoelectric conversion portion;

a second transfer gate disposed on the side including the first surface and transferring signal charges generated in the second photoelectric conversion portion; and a floating diffusion portion to which the signal charges are transferred through the first transfer gate and the second transfer gate, and a second component comprising:

a second semiconductor substrate having a third surface and a fourth surface opposite to the third surface; and an insulator filled into a through-hole formed in the second semiconductor substrate, the second component and the first component being laminated to each other, wherein the insulator includes a first contact connected to the first transfer gate and a second contact connected to the second transfer gate, the second contact being positioned closest to the first contact, and a direction in which the first contact and the second contact are aligned intersects at an acute angle a direction in which the first photoelectric conversion portion and the second photoelectric conversion portion are aligned.

7. The photoelectric conversion device according to claim 6, wherein the first transfer gate and the second transfer gate are line-symmetric in a plan view with respect to the direction in which the first photoelectric conversion portion and the second photoelectric conversion portion are aligned.

8. The photoelectric conversion device according to claim 6, wherein the first transfer gate and the second transfer gate are made of polysilicon.

9. A photoelectric conversion system comprising:

the photoelectric conversion device according to claim 6, and a signal processing unit configured to generate an image based on a signal output from the photoelectric conversion device.

10. A moving body comprising:

the photoelectric conversion device according to claim 6, wherein the moving body includes a control unit configured to control movement of the moving body based on a signal output from the photoelectric conversion device.

* * * * *